(12) United States Patent
Ohguro

(10) Patent No.: US 7,402,907 B2
(45) Date of Patent: Jul. 22, 2008

(54) SEMICONDUCTOR DEVICE AND MANUFACTURING METHOD THEREOF

(75) Inventor: Tatsuya Ohguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 245 days.

(21) Appl. No.: 11/252,882

(22) Filed: Oct. 19, 2005

(65) Prior Publication Data

US 2006/0292729 A1 Dec. 28, 2006

(30) Foreign Application Priority Data

Jun. 27, 2005 (JP) .............................. 2005-186854

(51) Int. Cl.
*H01L 23/48* (2006.01)
*H01L 23/52* (2006.01)
*H01L 29/40* (2006.01)

(52) U.S. Cl. .................... 257/734; 438/48; 257/618

(58) Field of Classification Search .................. 257/1; 438/48

See application file for complete search history.

(56) References Cited

U.S. PATENT DOCUMENTS

| 4,678,957 A | 7/1987 | Harnden, Jr. et al. |
| RE33,568 E | 4/1991 | Harnden, Jr. et al. |
| 6,359,374 B1 | 3/2002 | Dausch et al. |
| 6,377,438 B1 | 4/2002 | Deane et al. |
| 6,577,476 B1 * | 6/2003 | Childress et al. ........ 360/324.11 |
| 2002/0096727 A1 * | 7/2002 | Fischer et al. ................ 257/415 |
| 2004/0004649 A1 * | 1/2004 | Bibl et al. ...................... 347/68 |
| 2005/0078154 A1 * | 4/2005 | Nakano et al. ................. 347/72 |
| 2006/0187613 A1 * | 8/2006 | Yoshii et al. ............. 361/321.2 |

* cited by examiner

Primary Examiner—Walter Lindsay, Jr.
Assistant Examiner—Abdulfattah Mustapha
(74) Attorney, Agent, or Firm—Foley & Lardner LLP

(57) ABSTRACT

A semiconductor device includes a semiconductor substrate, an actuator provided above the semiconductor substrate to move upwardly, a first electrode layer which is moved by the actuator, and a cap portion provided above the first electrode layer and including a second electrode layer.

11 Claims, 18 Drawing Sheets

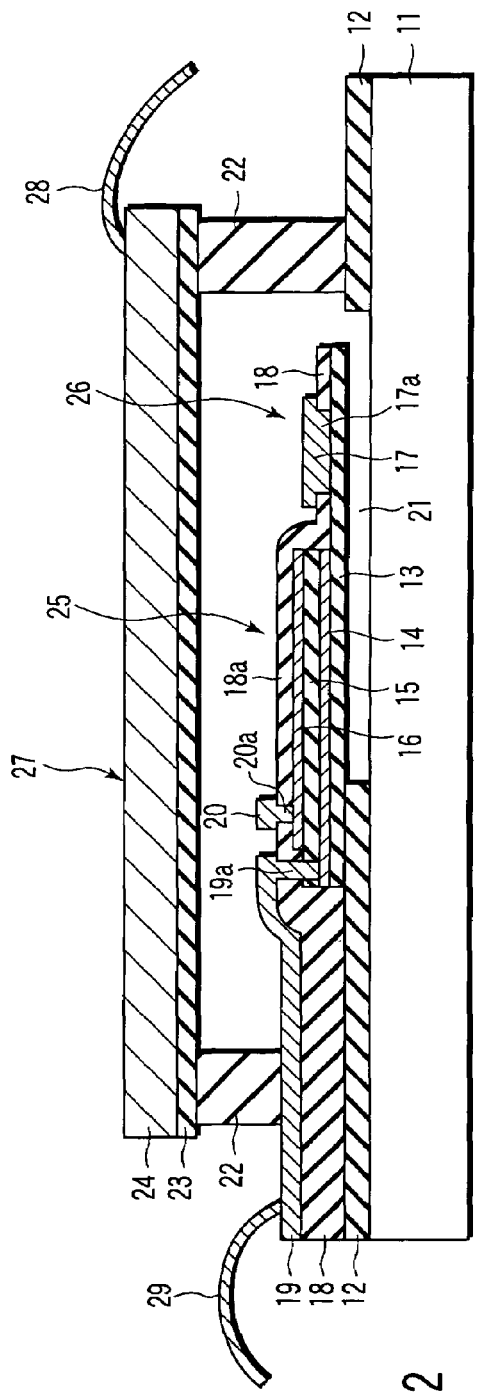
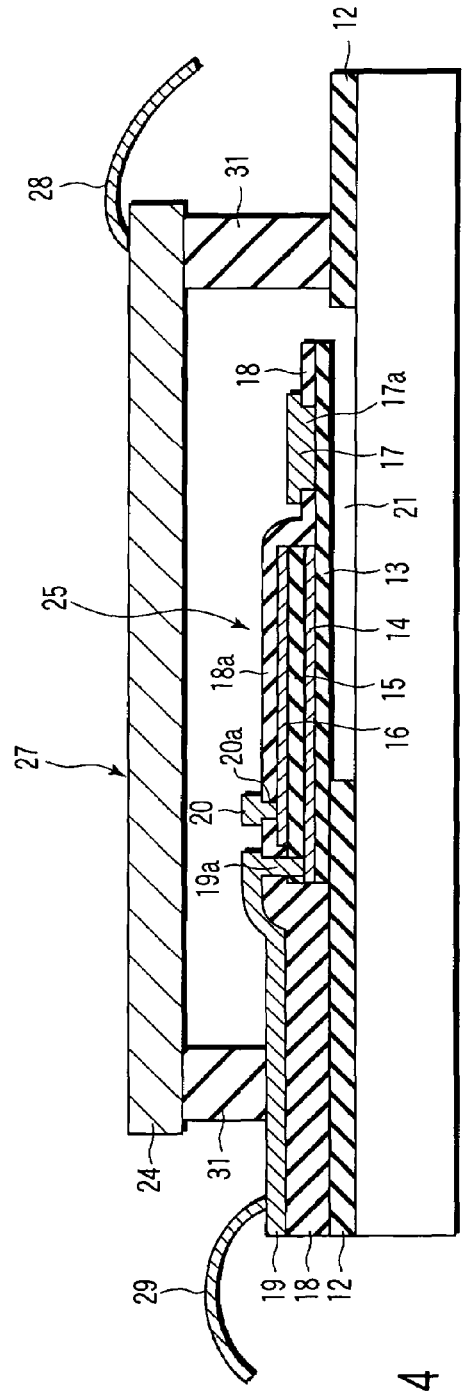

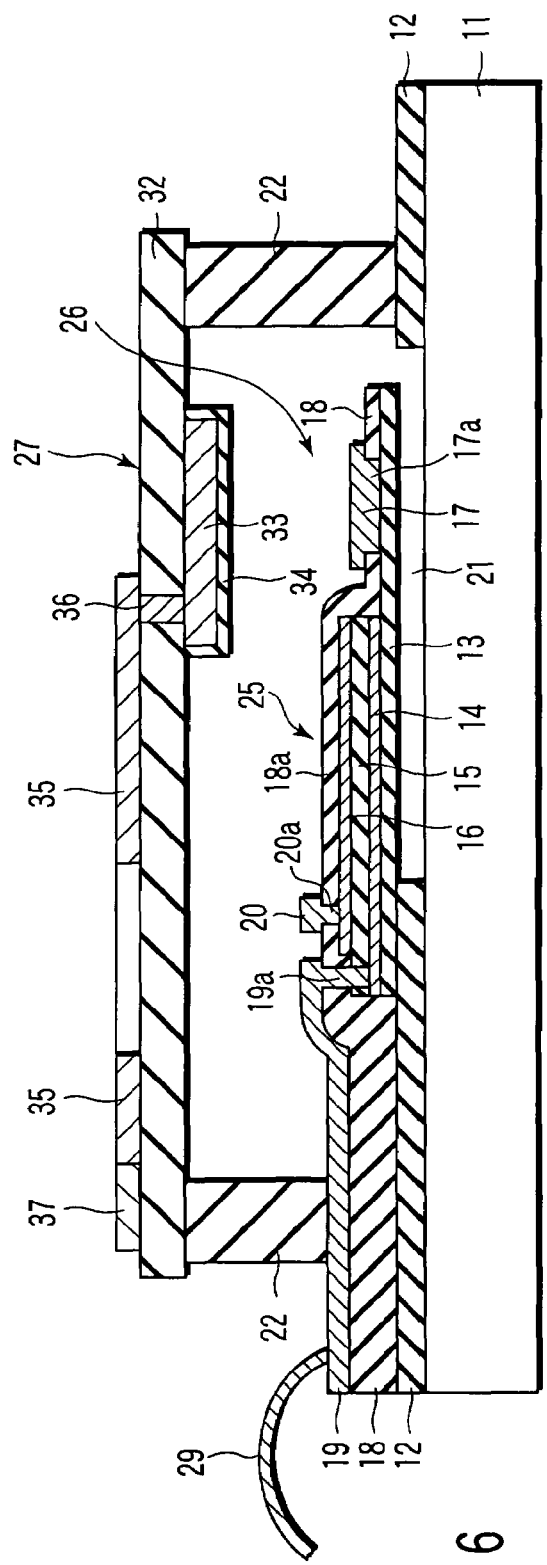
F I G. 6
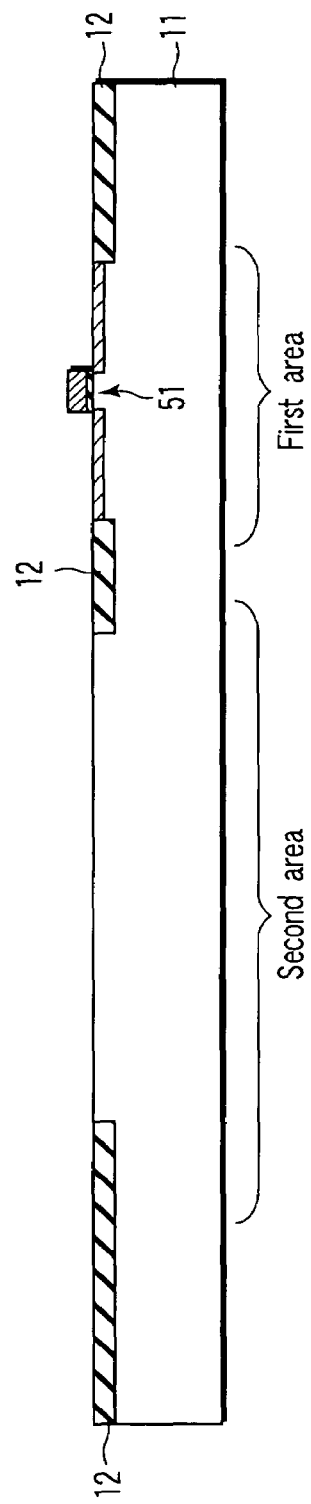
F I G. 9

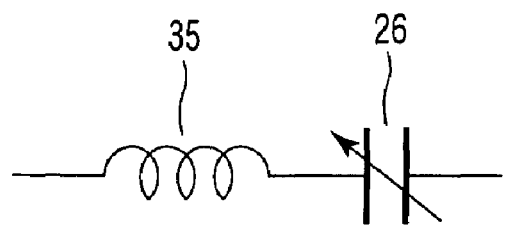
F I G. 7
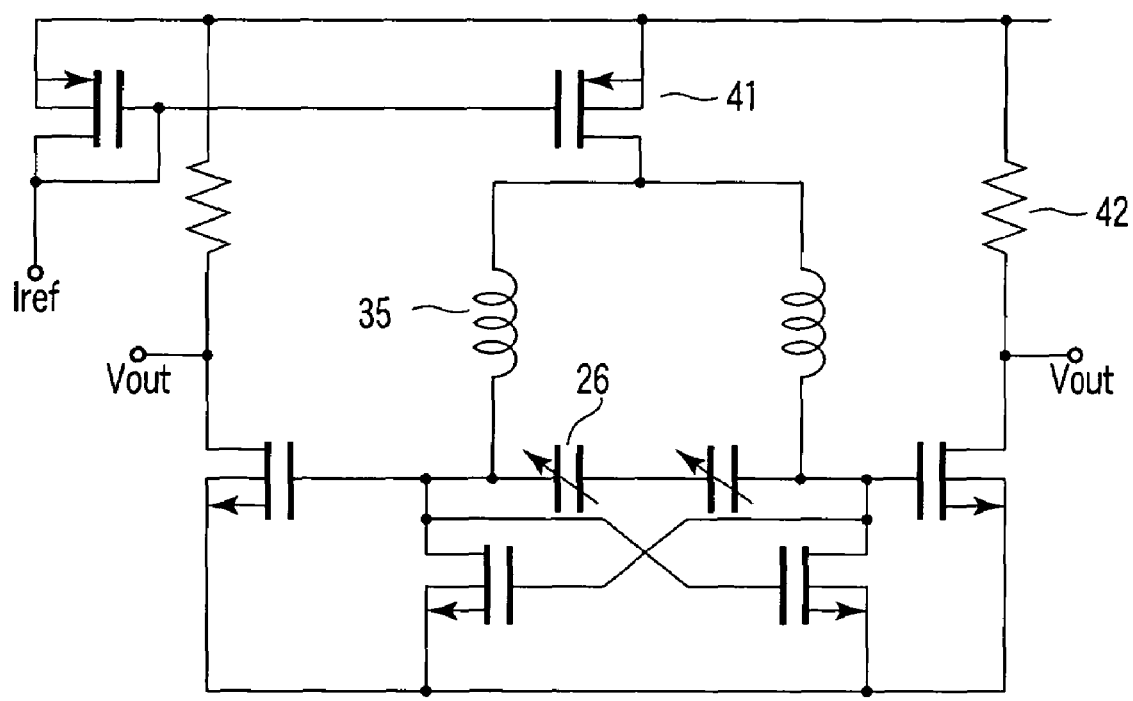
F I G. 8

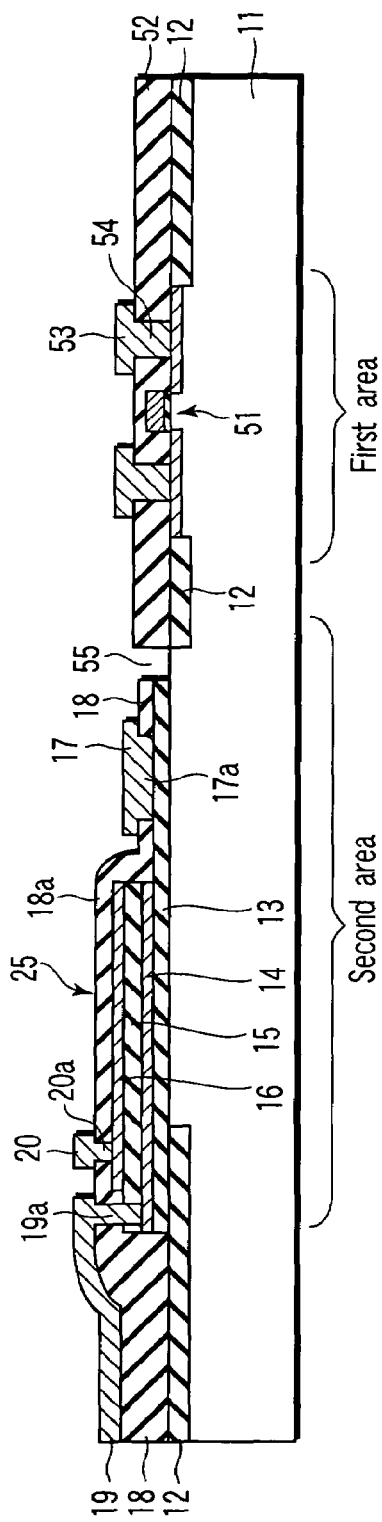
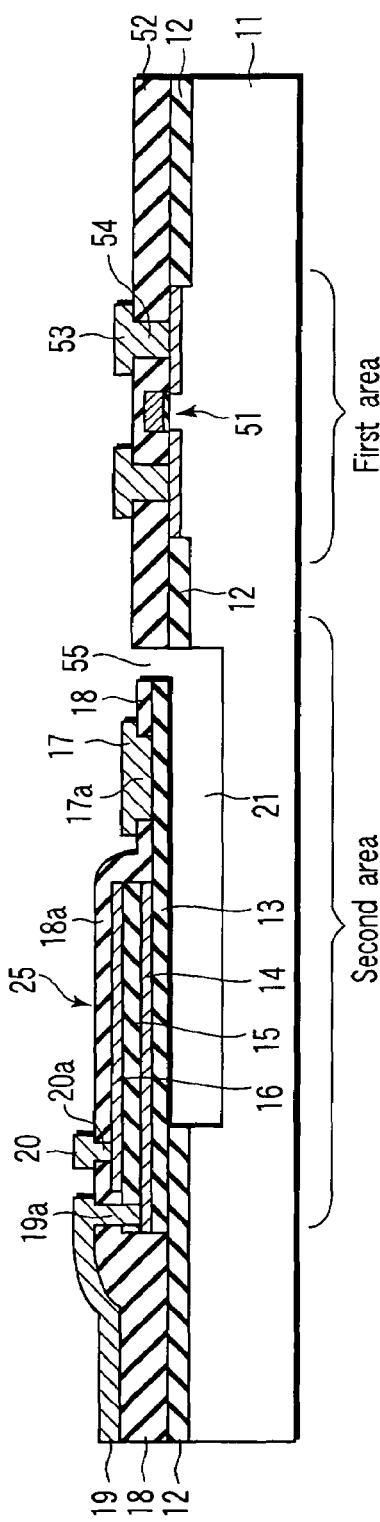

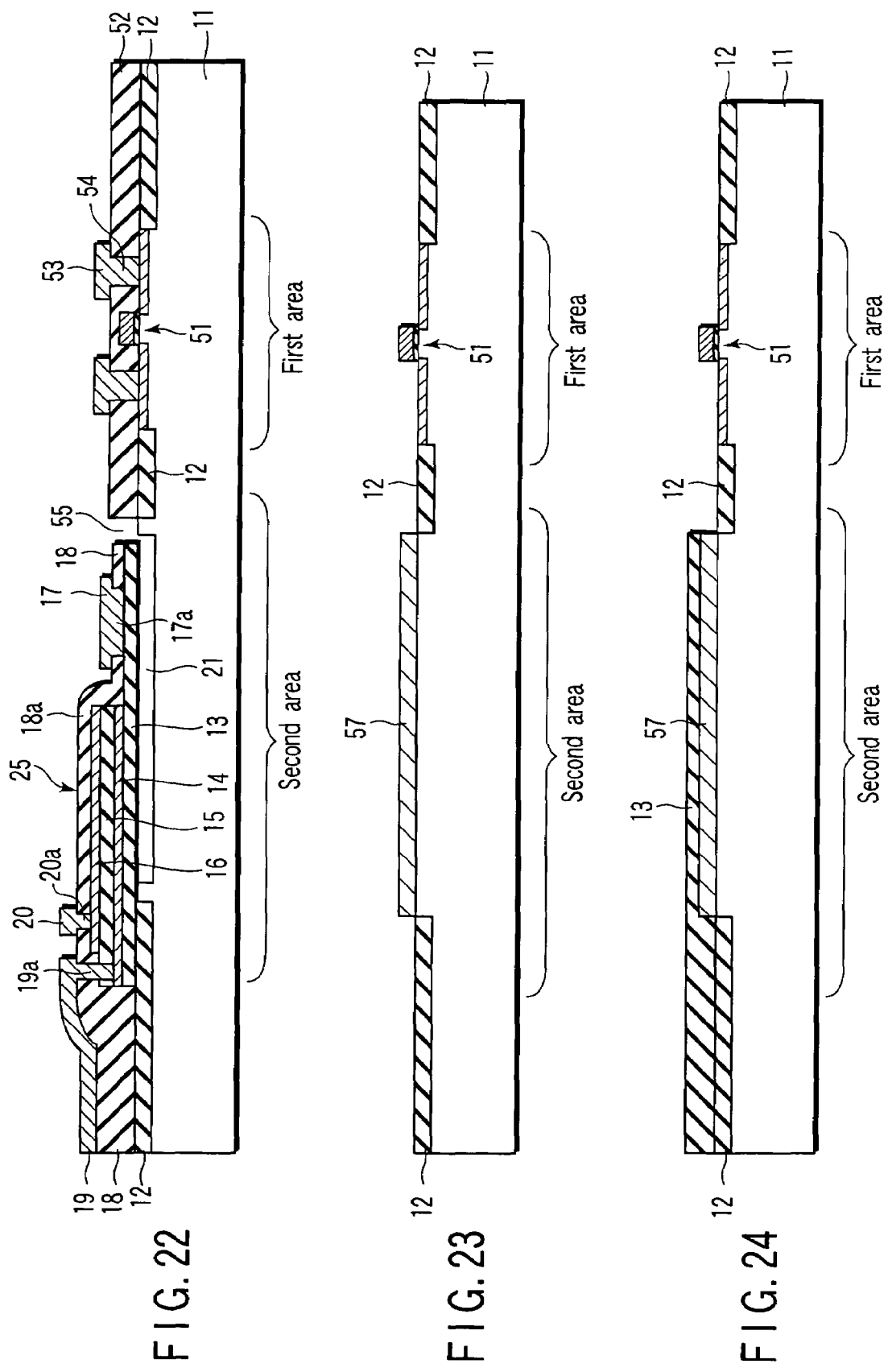

SEMICONDUCTOR DEVICE AND MANUFACTURING METHOD THEREOF

CROSS-REFERENCE TO RELATED APPLICATIONS

This application is based upon and claims the benefit of priority from prior Japanese Patent Application No. 2005-186854, filed Jun. 27, 2005, the entire contents of which are incorporated herein by reference.

BACKGROUND OF THE INVENTION

1. Field of the Invention

This invention relates to a semiconductor device and a manufacturing method thereof and, more particularly, to a semiconductor device comprising a MEMS (Micro Electro Mechanical Systems) device and a manufacturing method thereof.

2. Description of the Related Art

Recently, development of the Micromachine technology has proceeded. As one of techniques of the Micromachine technology, MEMS technique is known. The MEMS technique is a technique of finely producing a movable three-dimensional structure with the semiconductor processing technology.

As devices formed with the MEMS technique (called MEMS devices), variable capacitor, switch, acceleration sensor, pressure sensor, RF (radio frequency) filter, gyroscope, mirror device and the like are mainly studied and developed.

A variable capacitor using an actuator will be explained below. An actuator is a device capable of converting various kinds of energies such as electric energy, chemical energy and the like into dynamically kinetic energy to do a mechanical work.

When a variable capacitor is formed, an upper electrode and a lower electrode which the variable capacitor comprises need to be separated in a few µm. Thus, a cavity having a depth of a few µm needs to be formed in a part of a variable capacitor formation area and a lower electrode needs to be formed under the cavity.

The formation of the cavity needs, for example, steps of depositing an insulation layer having a thickness of a few µm, etching to form a groove having a depth of a few µm in the insulation layer, and depositing a sacrificial layer in the groove. For this reason, longer time is spent in the manufacturing process and the throughput is thereby degraded. Moreover, since the groove is not used for the process of forming a CMOS (Complementary Metal Oxide Semiconductor), mixed mounting of a CMOS is difficult.

As an associated technique of this kind, a piezoelectric MEMS element which functions as a variable capacitor has been disclosed (see U.S. Pat. No. 6,359,374 and U.S. Pat. No. 6,377,438).

BRIEF SUMMARY OF THE INVENTION

According to a first aspect of the present invention, there is provided a semiconductor device comprising: a semiconductor substrate; an actuator provided above the semiconductor substrate to move upwardly; a first electrode layer which is moved by the actuator; and a cap portion provided above the first electrode layer and including a second electrode layer.

According to a second aspect of the present invention, there is provided a method of manufacturing a semiconductor device, comprising: forming a first insulation layer in a semiconductor substrate; forming a second insulation layer on the semiconductor substrate and the first insulation layer; forming an actuator moving upwardly and a first electrode layer which is moved by the actuator, on the second insulation layer; etching the semiconductor substrate under the second insulation layer, thereby forming a cavity under the second insulation layer in the semiconductor substrate; and forming a cap portion including a second electrode layer, above the first electrode layer.

According to a third aspect of the present invention, there is provided a method of manufacturing a semiconductor device, comprising: forming a first insulation layer in a semiconductor substrate; forming a sacrificial layer in the semiconductor substrate; forming a second insulation layer on the first insulation layer and the sacrificial layer; forming an actuator moving upwardly and a first electrode layer which is moved by the actuator, on the second insulation layer; etching the sacrificial layer, thereby forming a cavity under the second insulation layer in the semiconductor substrate; and forming a cap portion including a second electrode layer, above the first electrode layer.

According to a fourth aspect of the present invention, there is provided a method of manufacturing a semiconductor device, comprising: forming a sacrificial layer on a semiconductor substrate; forming a first insulation layer on the sacrificial layer and the semiconductor substrate; forming an actuator moving upwardly and a first electrode layer which is moved by the actuator, on the first insulation layer; etching the sacrificial layer, thereby forming a cavity between the semiconductor substrate and the first insulation layer; and forming a cap portion including a second electrode layer, above the first electrode layer.

According to a fifth aspect of the present invention, there is provided a method of manufacturing a semiconductor device, comprising: forming an interlayer insulation layer on a semiconductor substrate; forming a sacrificial layer in the interlayer insulation layer; forming a first insulation layer on the interlayer insulation layer and the sacrificial layer; forming an actuator moving upwardly and a first electrode layer which is moved by the actuator, on the first insulation layer; etching the sacrificial layer, thereby forming a cavity under the first insulation layer in the interlayer insulation layer; and forming a cap portion including a second electrode layer, above the first electrode layer.

According to a sixth aspect of the present invention, there is provided a method of manufacturing a semiconductor device, comprising: forming an interlayer insulation layer on a semiconductor substrate; forming a sacrificial layer on the interlayer insulation layer; forming a first insulation layer on the interlayer insulation layer and the sacrificial layer; forming an actuator moving upwardly and a first electrode layer which is moved by the actuator, on the first insulation layer; etching the sacrificial layer, thereby forming a cavity between the interlayer insulation layer and the first insulation layer; and forming a cap portion including a second electrode layer, above the first electrode layer.

BRIEF DESCRIPTION OF THE SEVERAL VIEWS OF THE DRAWING

FIG. 2 is a cross-sectional view showing the MEMS device shown in FIG. 1 as seen along line II-II;

FIG. 4 is a cross-sectional view showing the MEMS device shown in FIG. 3 as seen along line IV-IV;

FIG. 6 is a cross-sectional view showing the MEMS device shown in FIG. 5 as seen along line VI-VI;

FIG. 7 is a circuit diagram of the MEMS device shown in FIG. 5 and FIG. 6;

FIG. 8 is a circuit diagram of a VCO circuit to which the present invention is applied;

FIG. 9 is a cross-sectional view showing a manufacturing step of a semiconductor device according to a fourth embodiment of the present invention;

FIG. 15 is a cross-sectional view showing a manufacturing step of the semiconductor device according to the fourth embodiment of the present invention, following the step of FIG. 14;

FIG. 16 is a cross-sectional view showing a manufacturing step of the semiconductor device according to the fourth embodiment of the present invention, following the step of FIG. 15;

FIG. 22 is a cross-sectional view showing a manufacturing step of the semiconductor device according to the fifth embodiment of the present invention, following the step of FIG. 21;

FIG. 23 is a cross-sectional view showing a manufacturing step of a semiconductor device according to a sixth embodiment of the present invention;

FIG. 24 is a cross-sectional view showing a manufacturing step of the semiconductor device according to the sixth embodiment of the present invention, following the step of FIG. 23;

DETAILED DESCRIPTION OF THE INVENTION

Embodiments of the present invention will be explained below with reference to the accompanying drawings. Elements having like or similar functions and structures are denoted by similar reference numbers. They are repeatedly described if necessary.

First, embodiments of a structure of a MEMS device will be explained.

First Embodiment

Figure 1:
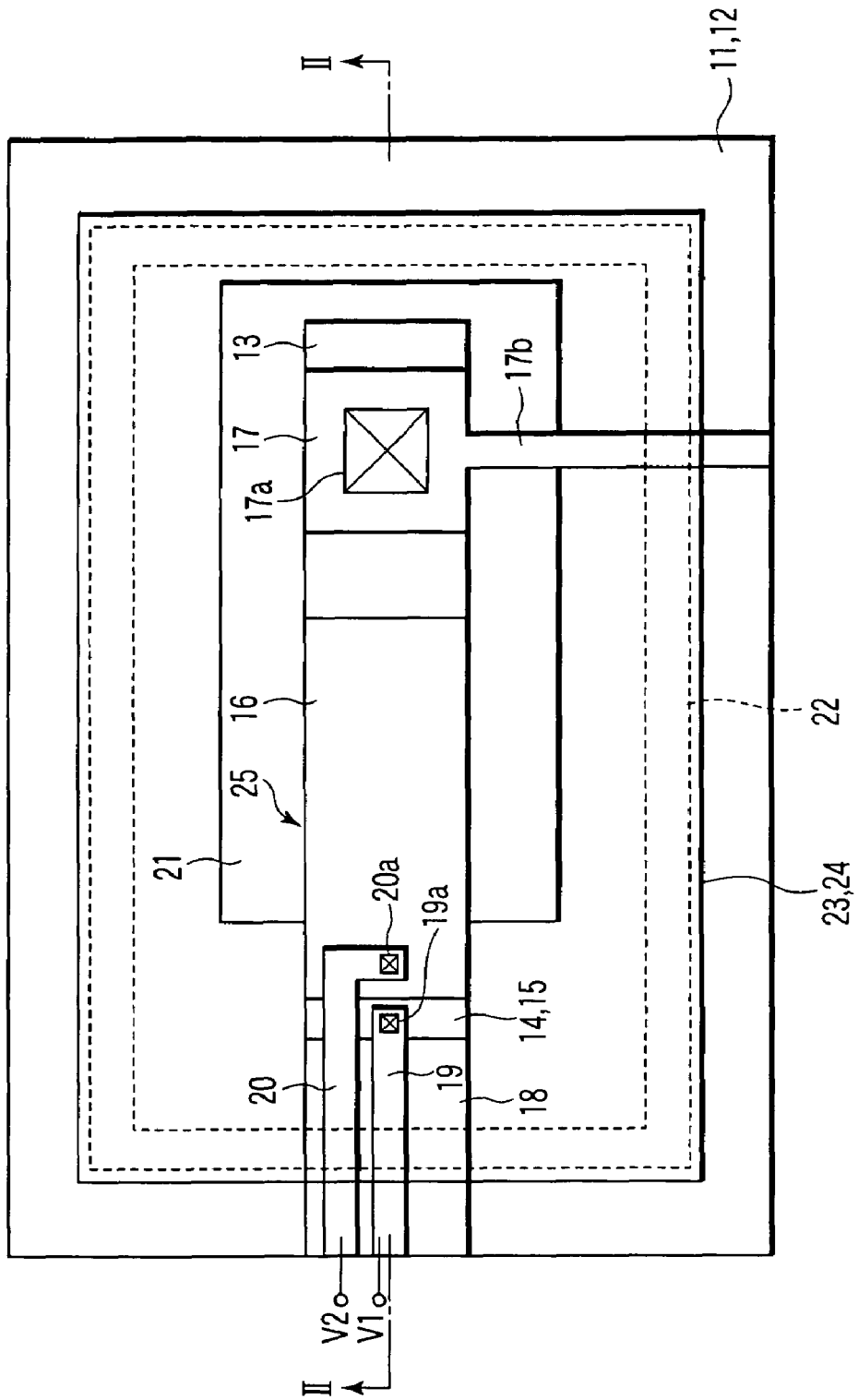
FIG. 1 is a plan view showing a MEMS device according to a first embodiment of the present invention.

FIG. 1 is a plan view showing a MEMS device according to a first embodiment of the present invention. FIG. 2 is a cross-sectional view showing the MEMS device shown in FIG. 1 as seen along line II-II. In the plan view, an internal structure of a cap portion 27 to be described later is drawn by solid lines for easy understanding of the invention.

An insulation layer 12 is provided on a semiconductor substrate 11. As the semiconductor substrate 11, for example, intrinsic semiconductor of Si, Ge or the like, compound semiconductor of GaAs, ZnSe or the like, or highly conductive semiconductor obtained by doping these semiconductors with impurities, can be used. The semiconductor substrate 11 may be a SOI (silicon on insulator) substrate.

The insulation layer 12 is formed of, for example, $SiO_2$. The insulation layer 12 is partially provided on the semiconductor substrate 11. A groove 21 is provided in the insulation layer 12. The groove 21 becomes a cavity 21 in which an actuator 25 to be described later can be moved. Depth of the cavity 21 is not particularly limited. For example, the cavity 21 may be shallow. Specifically, the actuator 25 is moved upwardly. If the actuator 25 can be moved freely, the depth of the cavity 21 is not significant. The depth of the cavity 21 can be adjusted in accordance with, for example, thickness of the insulation layer 12.

An insulation layer 13 is provided on the insulation layer 12 and the cavity 21. Specifically, one of end portions of the insulation layer 13 is provided on the insulation layer 12. The insulation layer 13 projects from the insulation layer 12 to an upper portion of the cavity 21. The other end portion (distal portion) of the insulation layer 13 is provided above the cavity 21 and is not fixed. Thus, the insulation layer 13 is can be simply moved in accordance with movement of the actuator 25. As the insulation layer 13, a single layer of SiN, single layer of $SiO_2$, single layer of $Al_2O_3$, lamination layer of $SiN/SiO_2$, lamination layer of $SiN/Al_2O_3$, or the like can be used.

The actuator 25 is provided on the insulation layer 13. The actuator 25 is composed of, for example, a piezoelectric element. The actuator 25 comprises a lower electrode layer 14, an upper electrode layer 16, and a piezoelectric layer 15 sandwiched between the lower electrode layer 14 and upper electrode layer 16. Of the lower electrode layer 14, the upper electrode layer 16 and the piezoelectric layer 15, at least the piezoelectric layer 15 is substantially flat. It is desirable that all of these three layers should be flat.

The area of the lower electrode layer 14 may be substantially equal to that of the upper electrode layer 16 or may be greater or smaller than that of the upper electrode layer 16. When the area of the lower electrode layer 14 is greater than that of the upper electrode layer 16 as shown in the figures, there is an advantage that a contact plug 19a connected to the lower electrode layer 14 can be easily extended upwardly.

The area of the piezoelectric layer 15 may be substantially equal to that of the lower electrode layer 14 or may be greater or smaller than that of the lower electrode layer 14. Moreover, the area of the piezoelectric layer 15 may be substantially equal to that of the upper electrode layer 16 or may be greater or smaller than that of the upper electrode layer 16. In other words, the piezoelectric layer 15, lower electrode layer 14 and upper electrode layer 16 may be equal in plane shape or at least one of them may be different in plane shape.

The plane shape of the piezoelectric layer 15, lower electrode layer 14 and upper electrode layer 16 can be set variously. For example, the plane shape may be a polygon (square, rectangle, quadrilateral, hexagon or the like) or a circle. The plane shape of the upper electrode layer 16 may be a shape having five or more sides with obtuse angles. In this case, there is an advantage of preventing the upper electrode layer 16 from being peeled off from the piezoelectric layer 15 or deformed.

A first electrode layer 17 of a variable capacitor 26 is formed at one of ends of the actuator 25. It is desirable that the insulation layer 12 should exist below the other end of the actuator 25 which is opposite to the first electrode layer 17. In other words, it is desirable that the actuator 25 should be partially positioned above the insulation layer 12 rather than being entirely positioned above the cavity 21. The reason is that if the insulation layer 12 functions as a fulcrum at the movement of the actuator 25, control of the movement can be enhanced.

As the material of the lower electrode layer 14 and upper electrode layer 16 of the actuator 25, for example, (a) any one material selected from a material group consisting of Pt, Sr, Ru, Cr, Mo, W, Ti, Ta, Al, Cu, and Ni, (b) a nitride containing at least one material selected from the material group, (c) a conductive oxide (for example, SrRuO) containing at least one material selected from the material group, (d) a compound of materials selected from the material group, (e) a laminate of the materials selected from (a) to (d), or the like can be used.

As the material of the piezoelectric layer 15 of the actuator 25, for example, a ceramic piezoelectric material such as PZT (Pb (Zr, Ti) $O_3$), AlN, ZnO, PbTiO, BTO (BaTiO$_3$) and the like, a polymeric piezoelectric material such as PVDF (polyvinylidene fluoride) or the like can be used.

An insulation layer 18 is provided on the insulation layer 13 and the insulation layer 12 so as to cover the actuator 25. A single layer formed of $SiO_2$ or the like can be employed as the insulation layer 18.

Incidentally, the thickness of the insulation layer 18a provided on the actuator 25 is set to be smaller than the thickness of the insulation layer 13. For example, the insulation layer 18a is set to be substantially half as thick as the insulation layer 13. However, the thickness of the insulation layer 18a is not limited to this, but may be even a little smaller than the thickness of the insulation layer 13. Thus, magnitude of a stress applied from an upper side to the piezoelectric layer 15 of the actuator 25 and magnitude of a stress applied thereto from a lower side can be varied. In other words, the stress applied from the upper side becomes smaller than the stress applied from the lower side.

If a bias voltage is applied to both ends of the piezoelectric layer 15, the piezoelectric layer 15 is distorted (more specifically, the piezoelectric layer 15 is shrunk in a lateral direction). At this time, the actuator 25 can be moved upwardly due to the difference between the stress applied from the upper side to the piezoelectric layer 15 and the stress applied thereto from the lower side.

In addition, the insulation layer 18a and the insulation layer 13 may be equal in thickness and the lower electrode layer 14 and upper electrode layer 16 of the actuator may be different in thickness. In other words, the thickness of the upper electrode layer 16 is set to be smaller than the thickness of the lower electrode layer 14. For example, the thickness of the upper electrode layer 16 is 50 nm and the thickness of the lower electrode layer 14 is 200 nm. If a bias voltage is applied to both ends of the piezoelectric layer 15, the piezoelectric layer 15 is shrunk in a lateral direction. At this time, if the thickness of the upper electrode layer 16 is made smaller than the thickness of the lower electrode layer 14, the actuator 25 can be moved upwardly.

Moreover, the total thickness of the insulation layer 13 and lower electrode layer 14 may be different from the total thickness of the insulation layer 18a and upper electrode layer 16. In other words, the total thickness of the insulation layer 18a and upper electrode layer 16 is set to be smaller than the total thickness of the insulation layer 13 and lower electrode layer 14. In this case, too, the actuator 25 can be moved upwardly.

A contact plug 17a is provided in the insulation layer 18, on the distal end of the insulation layer 13. The first electrode layer 17 is provided on the insulation layer 18 above the distal end of the insulation layer 13 so as to be connected to the contact plug 17a. As the material of the first electrode layer 17 and contact plug 17a, Al, Cu, W or the like can be used. A wiring layer 17b is connected to the first electrode layer 17. For example, a high-frequency signal is supplied to the first electrode layer 17 via the wiring layer 17b.

A wiring layer 19 and a wiring layer 20 are provided on the insulation layer 18. The wiring layer 19 is electrically connected to the lower electrode layer 14 via the contact plug 19a. The wiring layer 20 is electrically connected to the upper electrode layer 16 via a contact plug 20a.

The cap portion 27 which functions as a second electrode layer of the variable capacitor 26 is provided above the actuator 25 and the first electrode layer 17. The cap portion 27 includes a conductive layer 24, an insulation layer 23 and a support layer 22. The cap portion 27 is bonded to the substrate with, for example, an insulating bonding agent.

The conductive layer 24 is provided above the actuator 25 and the first electrode layer 17. More specifically, the conductive layer 24 is spaced from the first electrode layer 17 with a predetermined distance while covering the actuator 25 and the first electrode layer 17. The insulation layer 23 is provided under the conductive layer 24 to prevent electric contact between the first electrode layer 17 and the conductive layer 24.

Moreover, to space the first electrode layer 17 and the conductive layer 24 (second electrode layer) from each other with a predetermined distance, the support layer 22 which supports the conductive layer 24 and the insulation layer 23 is provided. More specifically, the support layer 22 is provided on the insulation layer 12, the wiring layers 19 and 20, and the insulation layer 18 so as to surround the actuator 25 and first electrode layer 17. As a result, the cap portion 27 seals a chip comprising the actuator 25, the first electrode layer 17 and the like.

The plan shape of the conductive layer 24 is set to be, for example, a square and may be any shape if the conductive layer 24 can cover the actuator 25 and the first electrode layer 17. In other words, the conductive layer 24 may be shaped in polygon or circle. The plan shape of the insulation layer 23 is substantially the same as, for example, the plan shape of the conductive layer 24. An outer periphery of the support layer 22 is substantially the same as, for example, an outer periphery of the conductive layer 24.

For example, an interior of the cap portion 27 is evacuated. The pressure inside the cap portion 27 and gases to be supplied therein are not limited. For example, the inner pressure may be equal to barometric pressure. The gases may mainly contain nitrogen gas or may be equal to atmospheric gases. In a case where nitrogen gas is used, corrosion of elements inside the cap portion 27 can be prevented.

As the conductive layer 24, Si, Al, Cu or the like doped with impurities of high concentration can be used. As the insulation layer 23, an insulator such as glass, $SiO_2$, SiN, AlN, Hf-oxide, $Al_2O_3$, or the like can be used. As the support layer 22, an insulator such as $SiO_2$, SiN or the like can be used.

The cap portion 27 functions as, for example, a package which physically and chemically protects internal elements. The following is a method of forming the cap portion 27. A plurality of MEMS devices are formed on a wafer. The package (cap portion 27) is formed by Wafer Level Package that implements packaging in the wafer state. After that, the wafer is subjected to dicing and a plurality of chips are thereby formed. A great number of chips can be manufactured by using the Wafer Level Package.

The method of forming the cap portion 27 is not limited to the Wafer Level Package. After dicing the wafer, the cap portion 27 may be formed for each of a plurality of chips.

In one chip, MEMS device alone may be formed as discrete product or MEMS device may be formed together with, for example, CMOS device.

A bonding wire 28 is provided on the conductive layer 24 to supply, for example, a ground potential to the conductive layer 24. The potential supplied to the conductive layer 24 is not limited to the ground potential, but may be the other fixed potential (for example, power supply potential).

A bonding wire 29 is provided on the wiring layer 19 to supply voltage V1 to the wiring layer 19. A bonding wire 29 is provided on the wiring layer 20 to supply voltage V2 to the wiring layer 20.

Operations of the MEMS device having the above-explained structure will be described. First, operations in a case where the actuator 25 is not in a moved state will be described. When the voltage V1 and voltage V2 of the lower electrode layer 14 and upper electrode layer 16 of the actuator 25 are, for example, ground potential (0 V), the actuator 25 is not moved and remains in the state shown in FIG. 2. When the actuator 25 is in the state shown in FIG. 2, capacitance value Cv of the variable capacitor 26 becomes smallest.

Next, operations in a case where the actuator 25 is in a moved state will be described. If the voltage V1 of the lower electrode layer 14 of the actuator 25 is set at, for example, the ground potential (0 V) and the voltage V2 of the upper electrode layer 16 is raised from 0 V to, for example, 3V, the piezoelectric layer 15 of the actuator 25 is shrunk in a lateral direction. The thickness of the insulation layer 18a becomes smaller than the thickness of the insulation layer 13 as described above. Therefore, the actuator 25 is moved upwardly since the stress from the insulation layer 18a is small.

As a result, the distance between the first electrode layer 17 of the variable capacitor 26 and the second electrode layer (conductive layer 24) becomes small. If the actuator 25 is moved and the first electrode layer 17 contacts the insulation layer 23, the capacitance value Cv of the variable capacitor 26 becomes greatest.

Thus, the actuator 25 is moved by adjusting the voltages V1 and V2 applied to the respective lower electrode layer 14 and upper electrode layer 16 of the actuator 25 and, consequently, the capacitance value Cv of the variable capacitor 26 can be varied by varying the distance between the two electrode layers of the variable capacitor 26.

In the present embodiment, as described above in detail, the lower electrode of the variable capacitor 26 does not need to be formed under the cavity 21 when the variable capacitor 26 is formed. If an electrode layer which is composed of the variable capacitor is formed under the actuator 25, a plurality of manufacturing steps are needed. As described above, however, since an under electrode does not need to be formed under the cavity 21, the manufacturing cost can be reduced. Moreover, the parasitic capacitance can also be reduced.

The cap portion 27 functions as the second electrode layer of the variable capacitor 26 and the package. Thus, the number of components can be reduced and the manufacturing cost can be reduced.

The actuator 25 is configured to move upwardly. Thus, the depth of the cavity 21 under the insulation layer 13 may be very small. In other words, the depth of the cavity 21 is not limited. Since the cavity 21 does not need to be formed with high accuracy, the manufacturing cost can be reduced.

The manufacturing step of forming the insulation layer 13 and the insulation layer 18a thinner than the insulation layer 13 is simpler than a case of forming the insulation layer 13 and the insulation layer 18a thicker than the insulation layer 13. Furthermore, the moving range of the actuator 25 can be adjusted in accordance with the thickness of the insulation layer 18a, after the lower electrode layer 14, the piezoelectric layer 15 and the upper electrode layer 16 are laminated. In other words, the movement of the actuator 25 can easily be controlled.

The ground potential is supplied to the conductive layer 24 of the cap portion 27. Thus, influence of the noise from the outside of the cap can be restricted. The potential supplied to the conductive layer 24 of the cap portion 27 is not limited to the ground potential, but may be the other fixed potentials (for example, power supply potential). In this case, too, the influence of the noise can be restricted.

The actuator 25 is sealed by using the cap portion 27. Thus, since the actuator 25 can be protected from an external environment, deterioration of the actuator 25 can be prevented.

In the present embodiment, the package (i.e. cap portion) is employed as the second electrode layer of the variable capacitor 26, but is not limited to this. The cap portion 27 may not seal the actuator 25 or first electrode layer 17. In other words, for example, the conductive layer 24 (second electrode layer) having substantially the same plane shape as the first electrode layer 17 is provided above the first electrode layer 17, and the insulation layer 23 is provided under the conductive layer 24. Then, the support layer 22 supporting the conductive layer 24 and insulation layer 23 is provided on the substrate. The support layer 22 is, for example, formed to partially support the conductive layer 24 and the insulation layer 23. In this structure, too, the variable capacitor 26 can also be formed.

Second Embodiment

Figure 3:
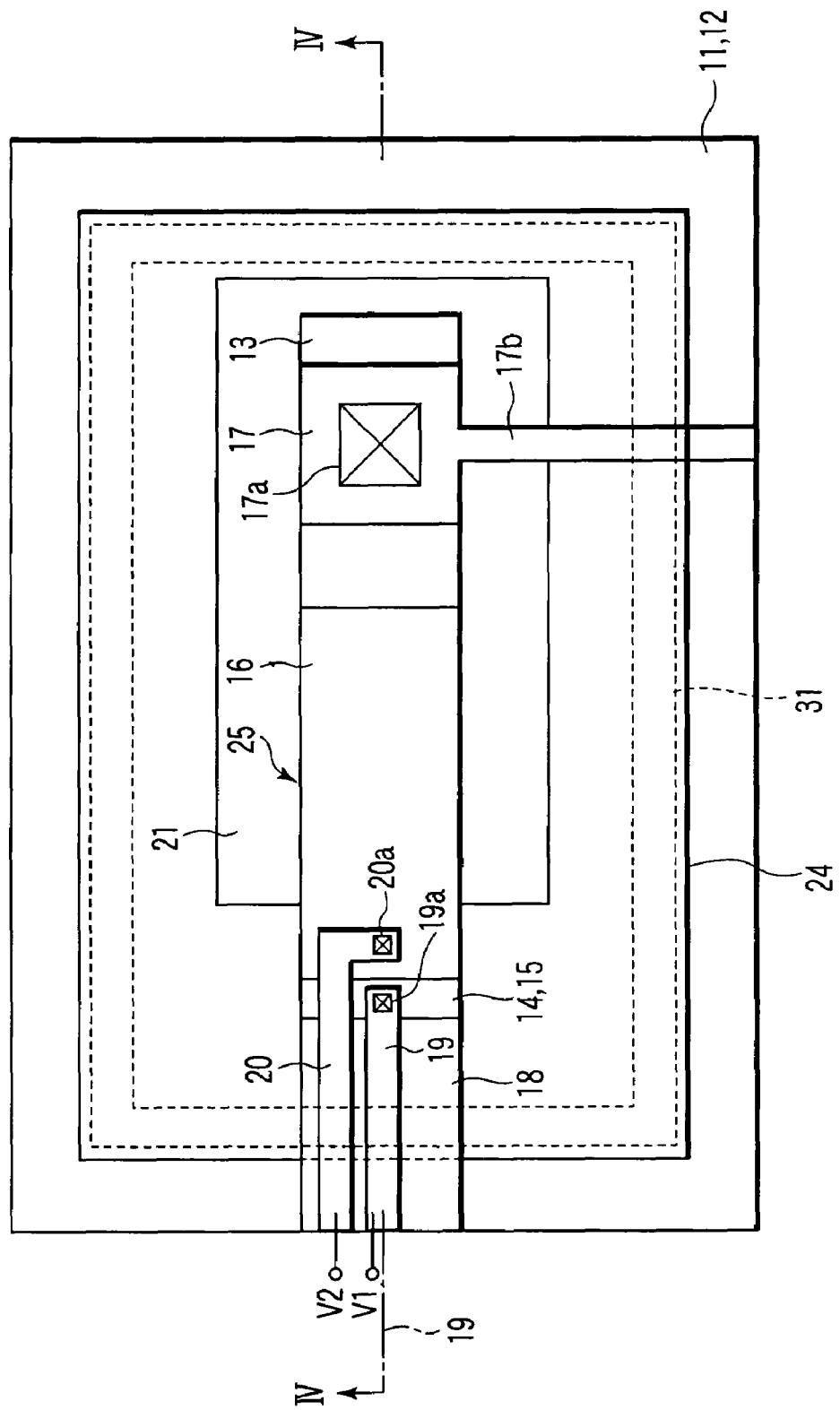
FIG. 3 is a plan view showing a MEMS device according to a second embodiment of the present invention.

In the second embodiment, the switch is formed with the actuator 25. FIG. 3 is a plan view showing a MEMS device according to a second embodiment of the present invention. FIG. 4 is a cross-sectional view showing the MEMS device of FIG. 3 as seen along line IV-IV.

The structure of the actuator 25 and the first electrode layer 17 included in the switch is the same as that in the first embodiment.

The cap portion 27 which functions as a second electrode layer of the switch is provided above the actuator 25 and the first electrode layer 17. The shape of the cap portion 27 is the same as that in the first embodiment, except absence of the insulation layer 23. The cap portion 27 is bonded to the substrate with, for example, an insulating bonding agent. In the present embodiment, As a support layer 31, an insulator such as $SiO_2$, SiN or the like can be used. The support layer 31 may be a conductive member. In this case, the support layer 31 is formed of the same material as the conductive layer 24.

Operations of the MEMS device having the above-explained structure will be described. First, operations in a case where the actuator 25 is not in a moved state will be described. When the voltage V1 and voltage V2 of the lower electrode layer 14 and upper electrode layer 16 of the actuator 25 are, for example, ground potential (0 V), the actuator 25 is not moved and remains in the state shown in FIG. 4. Since the first electrode layer and second electrode layer of the switch do not contact each other, the switch becomes in the OFF state.

Next, operations in a case where the actuator 25 is in a moved state will be described. If the voltage V1 of the lower electrode layer 14 of the actuator 25 is set at, for example, the ground potential (0 V) and the voltage V2 of the upper electrode layer 16 is raised from 0 V to, for example, 3V, the actuator 25 is moved upwardly. The first electrode layer and second electrode layer of the switch thereby contact each other, and the switch becomes in the ON state.

According to the present embodiment, as described above, the switch can be formed as a MEMS device. The other advantages are the same as those of the first embodiment.

Third Embodiment

Figure 5:
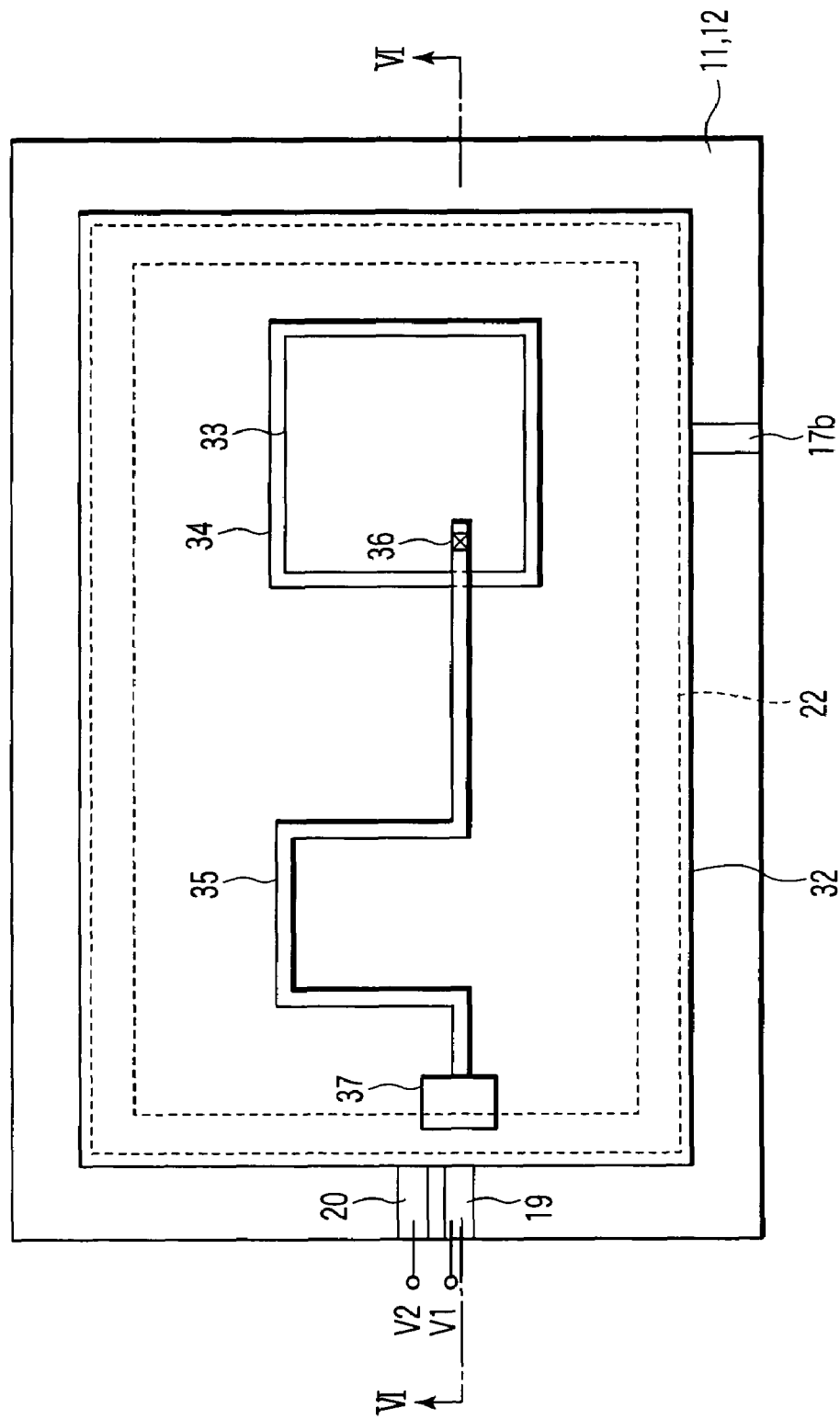
FIG. 5 is a plan view showing a MEMS device according to a third embodiment of the present invention.

In the third embodiment, an LC tank circuit (LC series resonant circuit) is formed with the actuator 25. FIG. 5 is a plan view showing a MEMS device according to the second embodiment of the present invention. FIG. 6 is a cross-sectional view showing the MEMS device of FIG. 5 as seen along line VI-VI. The shown structure is the same as the first embodiment, except the cap portion 27. Therefore, the actuator 25 and the first electrode layer 17 are not shown in the plan view of FIG. 5.

The cap portion 27 is provided to surround and cover the actuator 25 and the first electrode layer 17. The cap portion 27 comprises the support layer 22 formed of an insulator, an insulation layer 32, a second electrode layer 33 of the variable capacitor 26, an insulation layer 34, an inductor 35, a contact plug 36, and a terminal 37.

The second electrode layer 33 is provided above the first electrode layer 17. The area of the second electrode layer 33 may be greater or smaller than or equal to the area of the first electrode layer 17. The plane shape of the second electrode layer 33 may be different from or substantially the same as the plane shape of the first electrode layer 17. As the material of the second electrode layer 33, for example, Al, Cu, W or the like is used.

The insulation layer 34 is provided on lower and side surfaces of the second electrode layer 33. The insulation layer 34 may be provided on the lower surface of the second electrode layer 33 alone. As the insulation layer 34, an insulator such as glass, $SiO_2$, SiN, AlN, Hf-oxide, $Al_2O_3$ or the like is used.

The insulation layer 32 is provided on the second electrode layer 33 and support layer 22 to cover the actuator 25 and first electrode layer 17. As the insulation layer 32, an insulator such as $SiO_2$, SiN or the like is used.

The inductor 35 is provided on the insulation layer 32. The shape of the inductor 35 may be square, spiral, meander or the like. As the inductor 35, for example, Al, Cu, W or the like is used.

A contact hole is formed in the insulation layer 32. The contact plug 36 is provided inside the contact hole to make an electric connection between the second electrode layer 33 and one of end portions of the inductor 35. The contact plug 36 is formed of the same material as, for example, the inductor 35.

The terminal 37 is provided at the other end portion of the inductor 35, on the insulation layer 32. The terminal 37 is formed of the same material as, for example, the inductor 35. The terminal 37 is connected to an external circuit via, for example, a bonding wire (not shown).

FIG. 7 is a circuit diagram of the MEMS device shown in FIG. 5 and FIG. 6. The MEMS device serves as an LC tank circuit. The LC tank circuit is formed by making a serial connection between the variable capacitor 26 and the inductor 35.

More specifically, the second electrode layer 33 of the variable capacitor 26 is connected to one of terminals of the inductor 35. The first electrode layer 17 of the variable capacitor 26 is connected to an external circuit via a wiring layer 17b. The other terminal of the inductor 35 is connected to an external circuit via the terminal 37.

In addition, a VCO (Voltage Controlled Oscillator) circuit can be formed by mixed mounting of a MOS transistor and a resistor on the MEMS device. FIG. 8 is a circuit diagram showing the VCO circuit.

The VCO circuit includes two inductors 35, two variable capacitors 26, six MOS transistors 41, and two resistors 42. These elements are formed on a common semiconductor substrate 11.

According to the present embodiment, as described above, the LC tank circuit or VCO circuit can be formed as the MEMS device. The other advantages are the same as the first embodiment.

Next, embodiments of a method of manufacturing a MEMS device (fourth to eighth embodiments) will be described.

Fourth Embodiment

A first example of a method of manufacturing a semiconductor device comprising, for example, a MOS transistor and a MEMS device, will be described.

First, a groove is formed on the semiconductor substrate 11 and an insulator is embedded in the groove to form STI (Shallow Trench Isolation) 12, as shown in FIG. 9. The STI corresponds to the insulation layer 12 shown in FIG. 2. The semiconductor substrate 11 has a first area where a MOS transistor is formed and a second area where a MEMS device is formed. A part of the insulation layer 12 is provided to electrically isolate the first area and the second area from each other.

Next, a MOS transistor 51 is formed in the first area of the semiconductor substrate 11. In other words, a gate insulation film is formed on the semiconductor substrate 11. A gate electrode is formed on the gate insulation film. Impurities are introduced into the semiconductor substrate 11 by using the gate electrode as a mask, and a source region and a drain region are formed in the semiconductor substrate 11 on both sides of the gate electrode.

Figure 10:
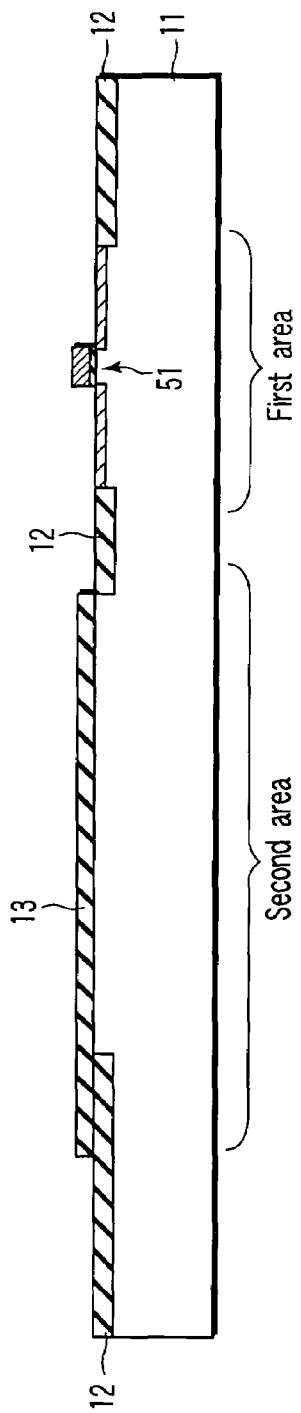
FIG. 10 is a cross-sectional view showing a manufacturing step of the semiconductor device according to the fourth embodiment of the present invention, following the step of FIG. 9.

Next, the insulation layer 13 is deposited on the semiconductor substrate 11 of the second area by, for example, CVD (Chemical Vapor Deposition) method, as shown in FIG. 10. The insulation layer 13 is etched in a desired shape by lithography and RIE (Reactive Ion Etching) method. At this time, one of end portions of the insulation layer 13 is formed on the insulation layer 12. Thus, even if the cavity 21 is formed under the insulation layer 13, the insulation layer 13 can support the actuator 25 by using the insulation layer 12 as a fulcrum.

Figure 11:
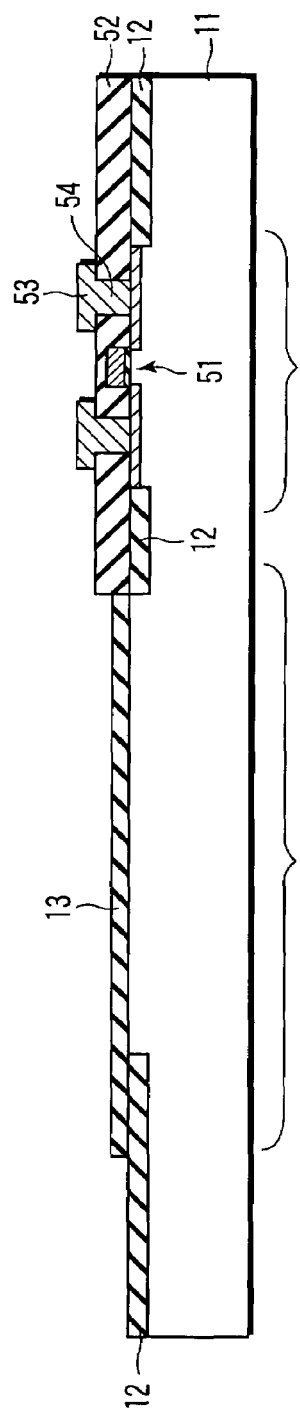
FIG. 11 is a cross-sectional view showing a manufacturing step of the semiconductor device according to the fourth embodiment of the present invention, following the step of FIG. 10.

Next, a wiring layer 53 to be electrically connected to the MOS transistor 51 is formed as shown in FIG. 11. In other words, an interlayer insulation layer 52 is deposited on the MOS transistor 51. The interlayer insulation layer 52 is formed of, for example, $SiO_2$. Then, a contact hole is formed to expose, for example, the source region and drain region of the MOS transistor 51. A conductor is embedded in the contact hole to form a contact plug 54 which is electrically connected to the source region and the drain region. The wiring layer 53 is formed to be electrically connected to the contact plug 54.

Figure 12:
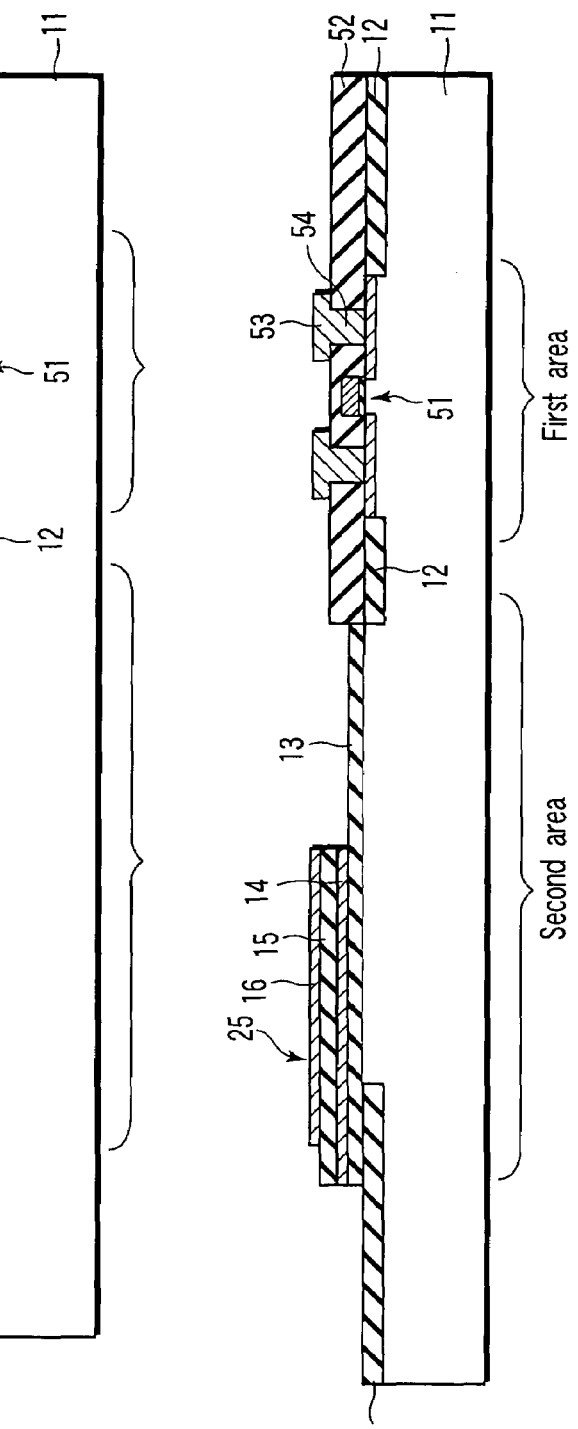
FIG. 12 is a cross-sectional view showing a manufacturing step of the semiconductor device according to the fourth embodiment of the present invention, following the step of FIG. 11.

Next, the lower electrode layer 14, the piezoelectric layer 15, and the upper electrode layer 16 are deposited in order on the insulation layer 13 by, for example, spattering, as shown in FIG. 12. Then, the upper electrode layer 16 and the piezoelectric layer 15 are patterned to expose a part of the lower electrode layer 14. Furthermore, the lower electrode layer 14, the piezoelectric layer 15, and the upper electrode layer 16 are patterned in a desired shape. Thus, the piezoelectric actuator 25 comprising the lower electrode layer 14, the piezoelectric layer 15, and the upper electrode layer 16 is formed.

Figure 13:
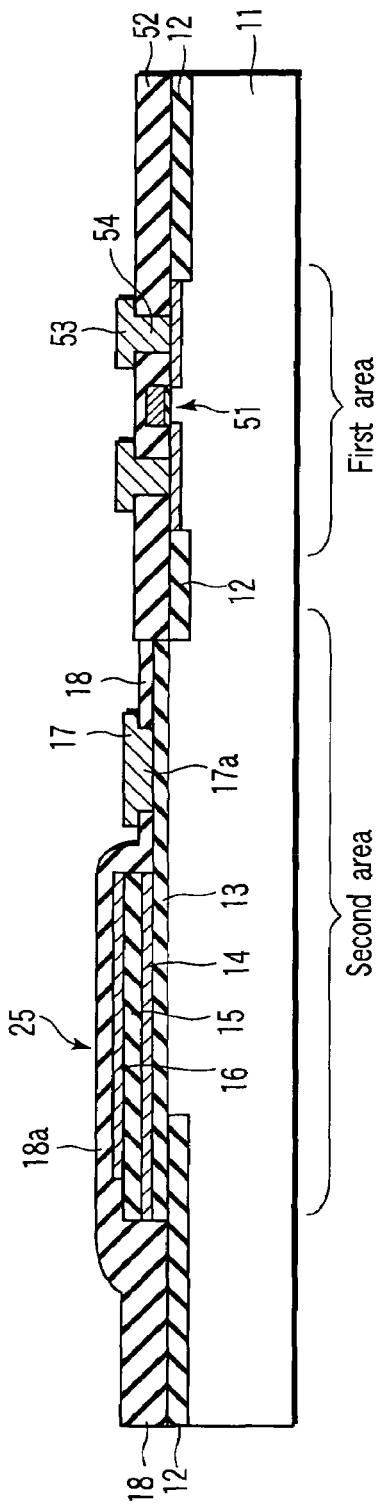
FIG. 13 is a cross-sectional view showing a manufacturing step of the semiconductor device according to the fourth embodiment of the present invention, following the step of FIG. 12.

Next, the insulation layer 18 is deposited on the actuator 25 and the insulation layer 13 by, for example, CVD method as shown in FIG. 13. A wiring groove is formed in the insulation layer 18 to expose a part of the insulation layer 13. A conductor is embedded in the wiring groove and the contact plug 17a is thereby formed in the wiring groove. The first electrode layer 17 is deposited on the contact plug 17a and the insulation layer 18. The first electrode layer 17 is patterned. The first electrode layer 17 of a desired shape is thereby formed. The wiring layer 17b is formed simultaneously with the first electrode layer 17.

Figure 14:
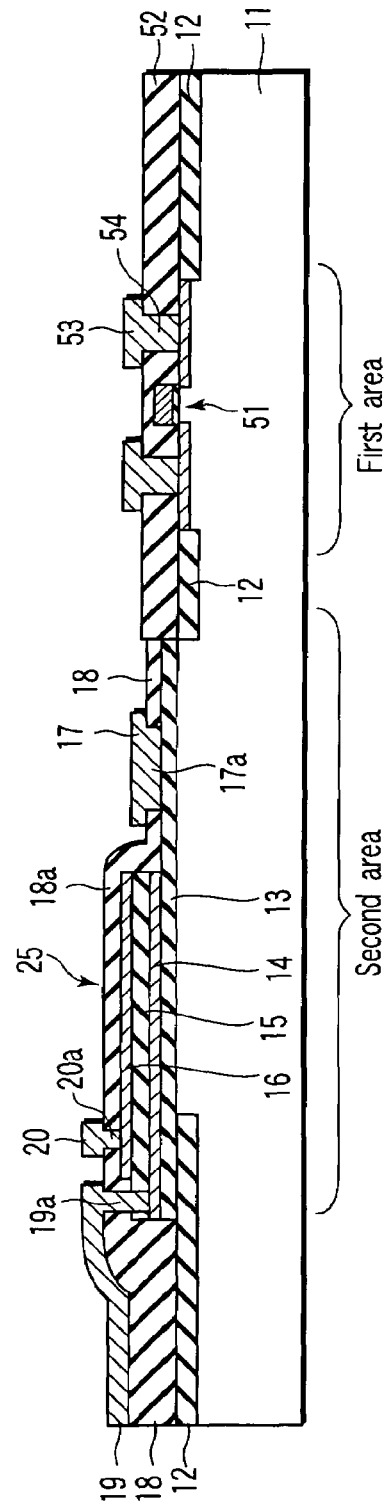
FIG. 14 is a cross-sectional view showing a manufacturing step of the semiconductor device according to the fourth embodiment of the present invention, following the step of FIG. 13.

Next, contact holes are formed to partially expose the lower electrode layer 14 and the upper electrode layer 16, respectively, conductors are embedded in the contact holes and the contact plugs 19a and 20a are thereby formed, as shown in FIG. 14. The wiring layers 19 and 20 are formed on the insulation layer 18 to be connected to the contact plugs 19a and 20a, respectively.

Next, the insulation layer 18 and the insulation layer 13 are partially etched by, for example, RIE method and a groove 55 is thereby formed at an edge portion of the insulation layer 13, to expose a part of the semiconductor substrate 11 in the first area, as shown in FIG. 15. The groove 55 may be formed simultaneously with formation of each of the insulation layer 18 and the insulation layer 13.

Next, the semiconductor substrate 11 under the insulation layer 13 is etched by CDE (Chemical Dry Etching) method using fluorine-based gas (gas containing fluorine) as shown in FIG. 16. As the fluorine-based gas, $XeF_2$ or the like can be used. As a result, the cavity 21 is formed under the insulation layer 13. Thus, the first electrode layer 17 is moved in accordance with the movement of the actuator 25.

Figure 17:
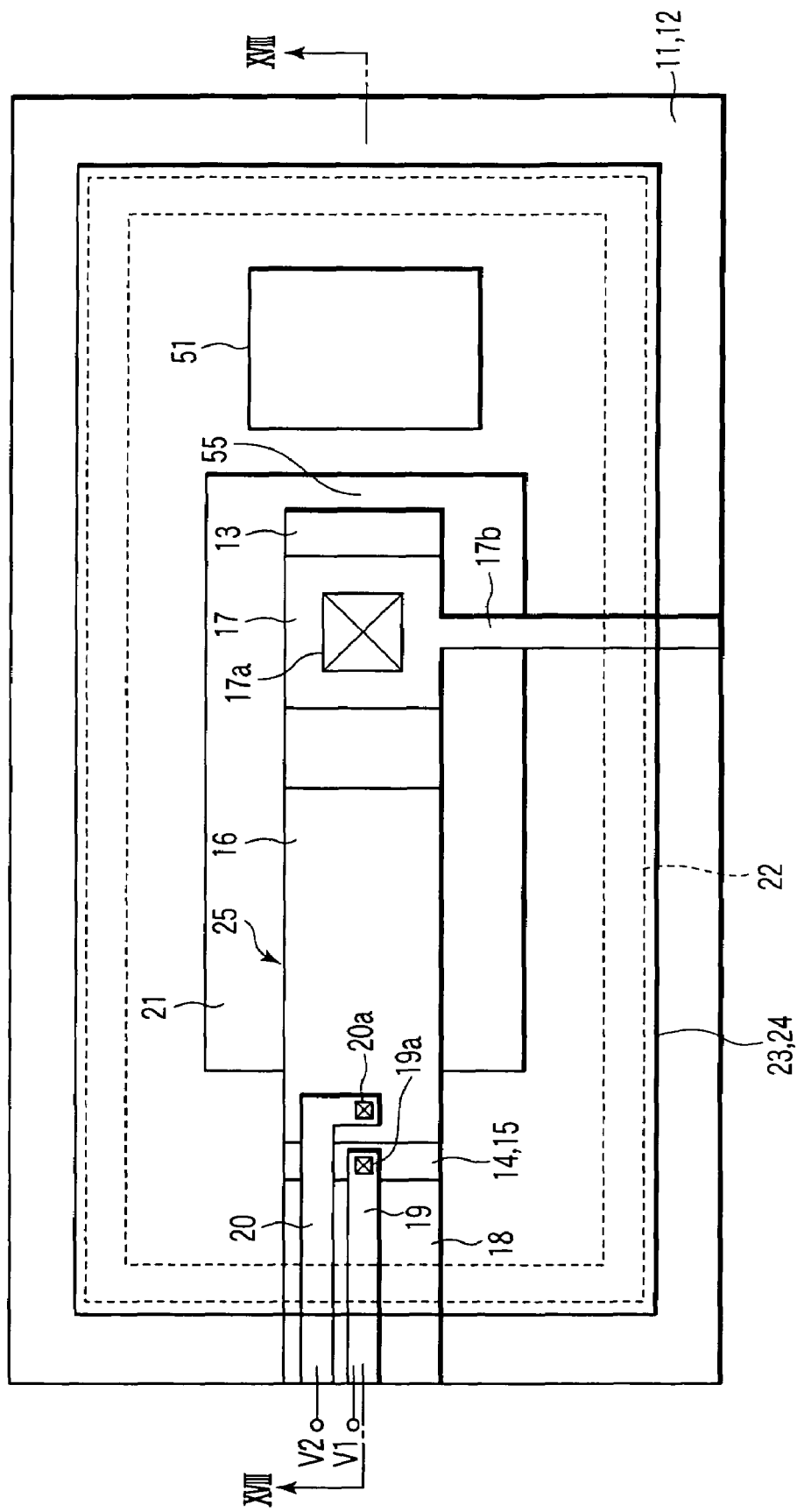
FIG. 17 is a cross-sectional view showing a manufacturing step of the semiconductor device according to the fourth embodiment of the present invention, following the step of FIG. 16.
Figure 18:
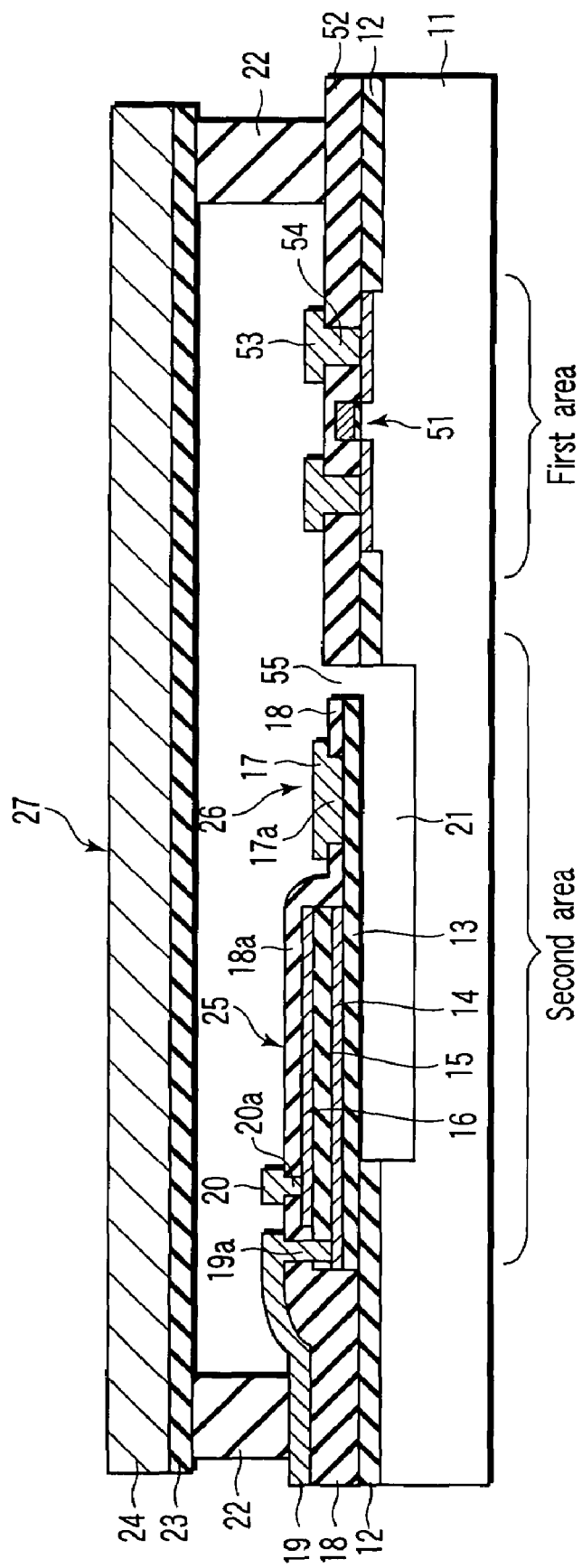
FIG. 18 is a cross-sectional view seen along line XVIII-XVIII of FIG. 17.

Next, the cap portion 27 which includes the conductive layer 24, the insulation layer 23 and the support layer 22 is formed as shown in FIG. 17 (plan view) and FIG. 18 (cross-sectional view seen along line XVIII-XVIII of FIG. 17). The cap portion 27 is formed in a size large enough to surround the actuator 255 and the MOS transistor 51. The cap portion 27 is bonded to the substrate with, for example, an insulating bonding agent. Thus, the semiconductor device shown in FIG. 17 and FIG. 18 is formed.

According to the present embodiment, as described above, manufacturing steps of forming the cavity 21 can be reduced. In other words, the cavity of a desired shape can be formed without using a sacrificial layer for formation of the cavity 21.

Such a manufacturing method can be employed in the present invention wherein an electrode or the like is not formed in the cavity 21 or the depth of the cavity 21 is not limited by moving the actuator 25 in the upward direction. As a result, the manufacturing cost can be reduced.

Fifth Embodiment

A second example of the method of manufacturing a semiconductor device comprising, for example, a MOS transistor and a MEMS device, will be described.

Figure 19:
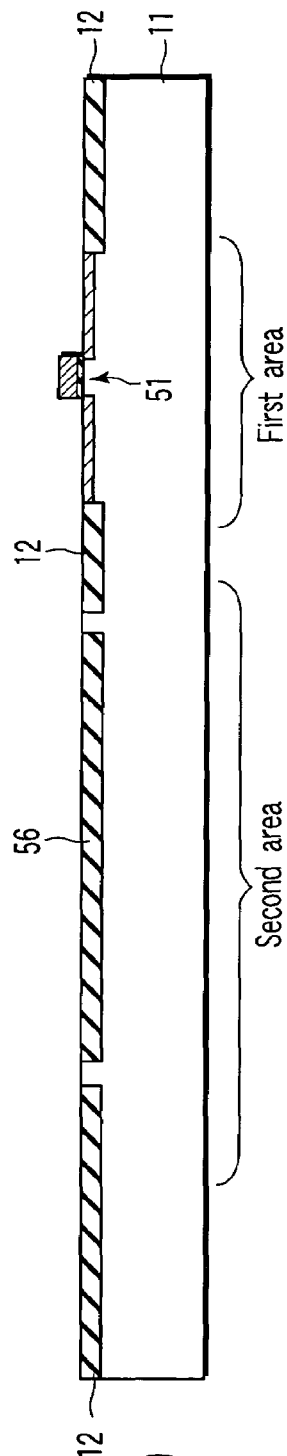
FIG. 19 is a cross-sectional view showing a manufacturing step of a semiconductor device according to a fifth embodiment of the present invention.

First, a groove is formed on the semiconductor substrate 11 and an insulator is embedded in the groove to form the STI (insulation layer) 12, as shown in FIG. 19. By employing the STI forming steps, a groove is formed in an area where the cavity 21 is to be formed, and an insulator (for example, $SiO_2$) is embedded in the groove to form a sacrificial layer 56. Then, the MOS transistor 51 is formed in the first area of the semiconductor substrate 11.

Figure 20:
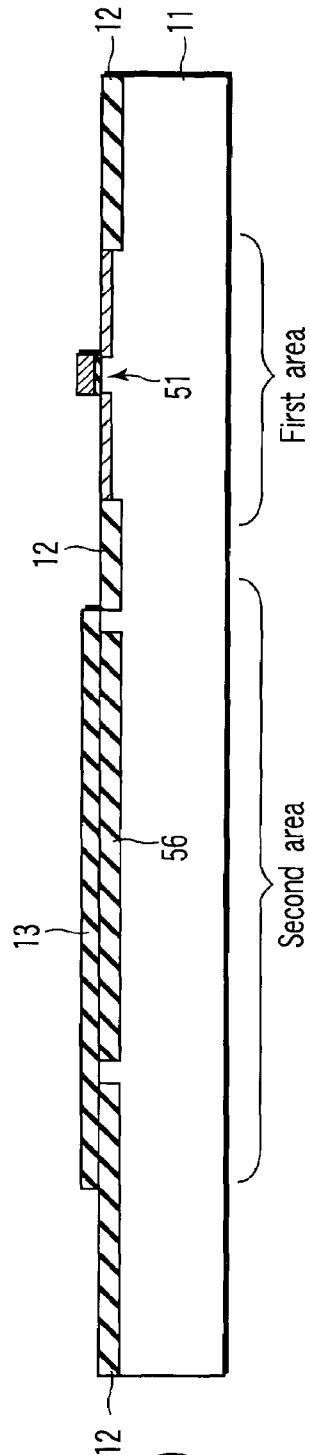
FIG. 20 is a cross-sectional view showing a manufacturing step of the semiconductor device according to the fifth embodiment of the present invention, following the step of FIG. 19.

Next, the insulation layer 13 is deposited on the sacrificial layer 56 and insulation layer 12, on the semiconductor substrate 11 of the second area by, for example, CVD method, as shown in FIG. 20. The insulation layer 13 is etched in a desired shape by lithography and RIE method.

Figure 21:
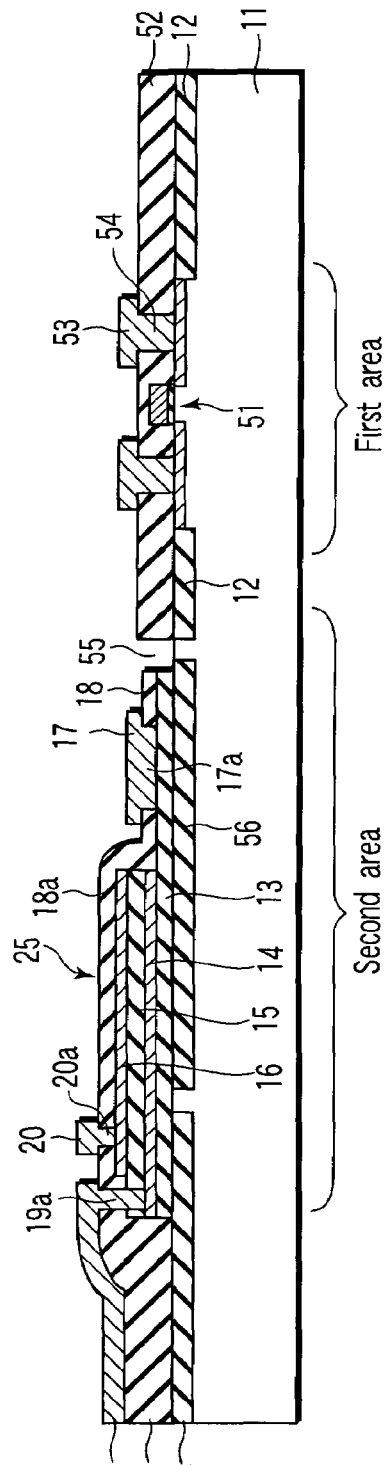
FIG. 21 is a cross-sectional view showing a manufacturing step of the semiconductor device according to the fifth embodiment of the present invention, following the step of FIG. 20.

Next, the actuator 25, the first electrode layer 17 and the wiring layers 19, 20 are formed similarly to the fourth embodiment. Then, the insulation layer 18 and the insulation layer 13 are partially etched by, for example, RIE method and the groove 55 is thereby formed at the edge portion of the insulation layer 13, to expose the sacrificial layer 56 under the edge portion of the insulation layer 13, as shown in FIG. 21. The groove 55 may be formed during the forming steps of each of the insulation layer 18 and the insulation layer 13.

Next, the sacrificial layer 56 is etched by CDE method using fluorine-based gas as shown in FIG. 22. As a result, the cavity 21 is formed under the insulation layer 13. After that, the substrate is covered with the cap portion 27.

According to the present embodiment, as described above, the sacrificial layer 56 used for formation of the cavity 21 can be formed by employing the STI processing steps. Therefore, especial manufacturing steps of forming the sacrificial layer 56 are unnecessary. As a result, the manufacturing cost can be reduced.

Sixth Embodiment

A third example of the method of manufacturing a semiconductor device comprising, for example, a MOS transistor and a MEMS device, will be described.

First, the MOS transistor 51 is formed in the first area of the semiconductor substrate 11 as shown in FIG. 23. Then, a sacrificial layer 57 of the same material as a gate electrode (formed of, for example, polysilicon) of the MOS transistor 51 is deposited on the semiconductor substrate 11. The sacrificial layer 57 is etched by lithography and RIE method to have the same shape as that of an area where the cavity 21 is to be formed. Etching the sacrificial layer 57 is executed in the same step as the gate electrode processing of the MOS transistor 51. The sacrificial layer 57 and the gate electrode may be silicide layers.

Next, the insulation layer 13 is deposited on the sacrificial layer 57 and insulation layer 12 by, for example, CVD method, as shown in FIG. 24. The insulation layer 13 is etched in a desired shape by lithography and RIE method. Then, the actuator 25, the first electrode layer 17 and the wiring layers 19, 20 are formed.

Figure 25:
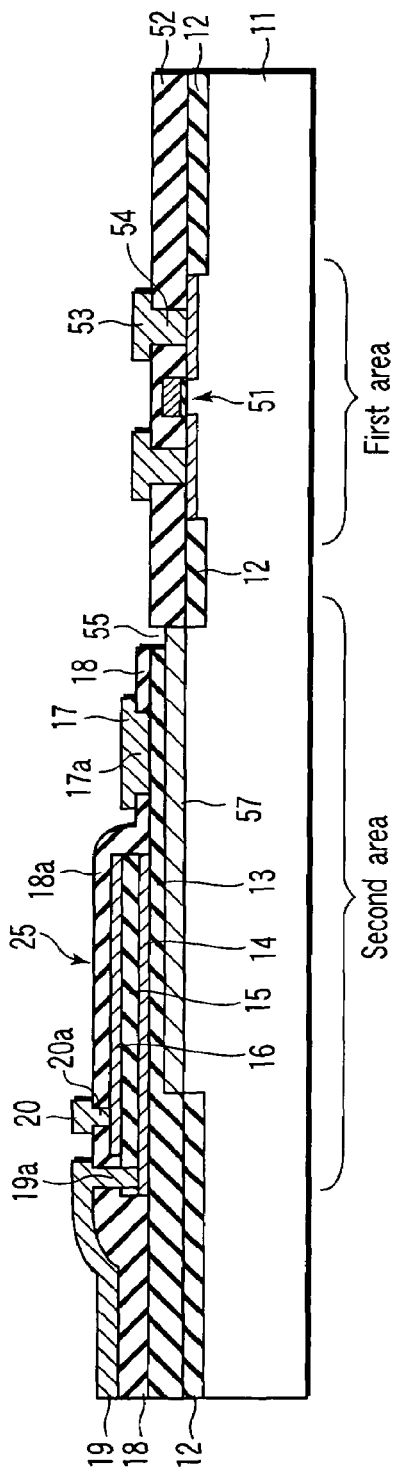
FIG. 25 is a cross-sectional view showing a manufacturing step of the semiconductor device according to the sixth embodiment of the present invention, following the step of FIG. 24.

Then, the insulation layer 18 and the insulation layer 13 are partially etched by, for example, RIE method to expose the sacrificial layer 57 under the edge portion of the insulation layer 13, and the groove 55 is thereby formed at the edge portion of the insulation layer 13, as shown in FIG. 25. The groove 55 may be formed simultaneously with formation of each of the insulation layer 18 and the insulation layer 13.

Figure 26:
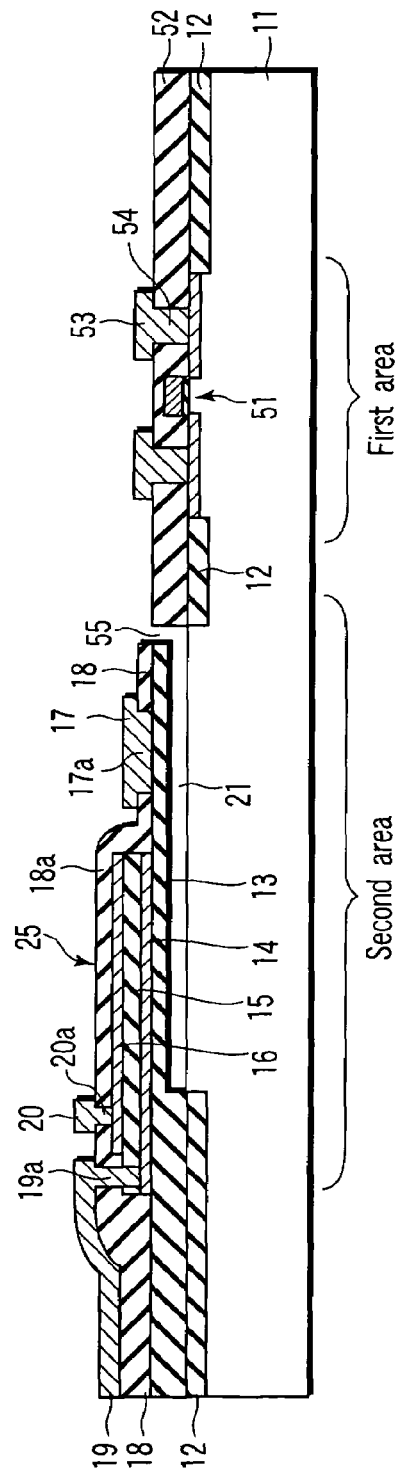
FIG. 26 is a cross-sectional view showing a manufacturing step of the semiconductor device according to the sixth embodiment of the present invention, following the step of FIG. 25.

Next, the sacrificial layer 57 is etched by CDE method using fluorine-based gas (gas containing fluorine) as shown in FIG. 26. As the fluorine-based gas, $XeF_2$ or the like can be used. As a result, the cavity 21 is formed under the insulation layer 13. After that, the substrate is covered with the cap portion 27.

According to the present embodiment, as described above, the sacrificial layer 57 used for formation of the cavity 21 can be formed by employing the gate electrode processing step. Therefore, especial manufacturing steps of forming the sacrificial layer 57 are unnecessary. As a result, the manufacturing cost can be reduced.

Seventh Embodiment

A fourth example of the method of manufacturing a semiconductor device comprising, for example, a MOS transistor and a MEMS device, will be described.

Figure 27:
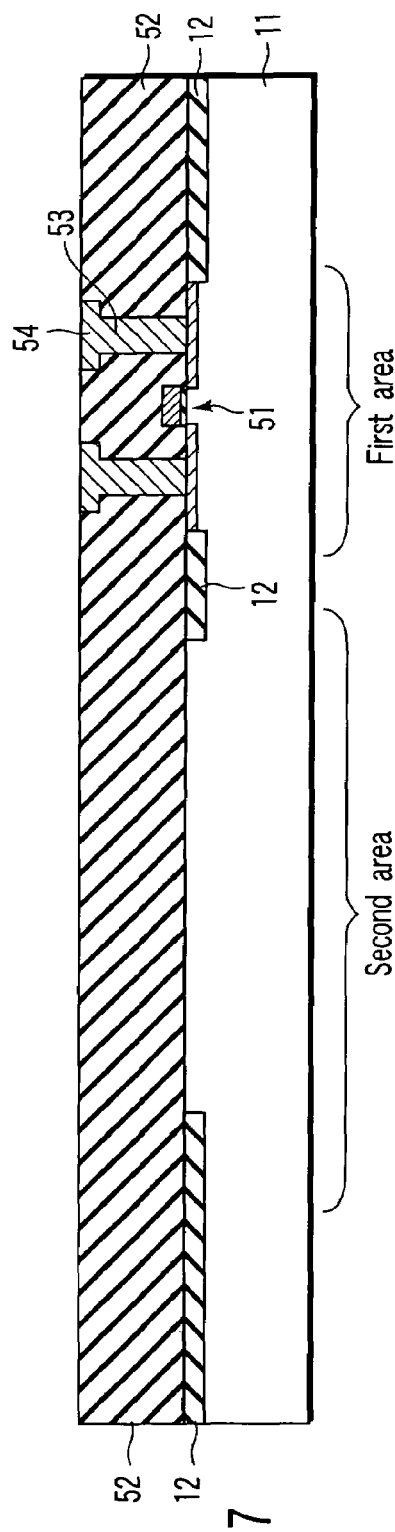
FIG. 27 is a cross-sectional view showing a manufacturing step of a semiconductor device according to a seventh embodiment of the present invention.

First, the MOS transistor 51 is formed as shown in FIG. 27. Then, the interlayer insulation layer 52 (formed of, for example, $SiO_2$) is deposited on the semiconductor substrate 11 by, for example, CVD method. The contact plug 54 and the wiring layer 53 are formed by, for example, dual damascene method.

Figure 28:
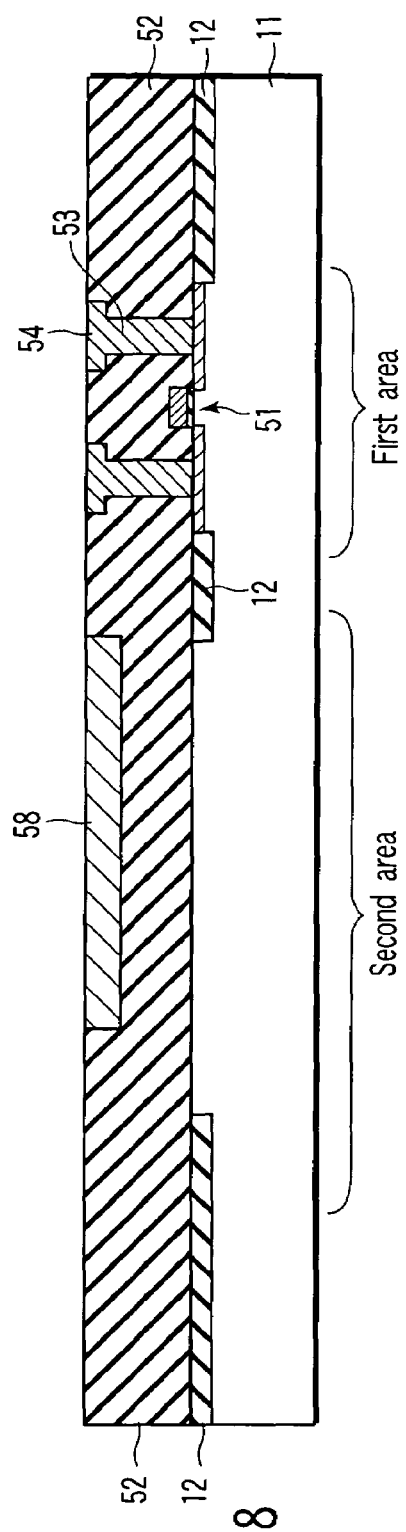
FIG. 28 is a cross-sectional view showing a manufacturing step of the semiconductor device according to the seventh embodiment of the present invention, following the step of FIG. 27.

Next, a groove is formed in the area where the cavity 21 is to be formed, in the interlayer insulation layer 52, and, for example, an organic material is embedded in the groove to form a sacrificial layer 58, as shown in FIG. 28. The material of the sacrificial layer 58 is not limited to the organic material, but may be a metal such as Cu or the like, polysilicon, oxide film or the like. In other words, any material can be used for the sacrificial layer 58 if it has a high selection ratio to the insulation material of the interlayer insulation layer 52. In addition, the sacrificial layer 58 can be formed in the forming step of the wiring layer 53 with the same material as the material of the wiring layer 53.

Figure 29:
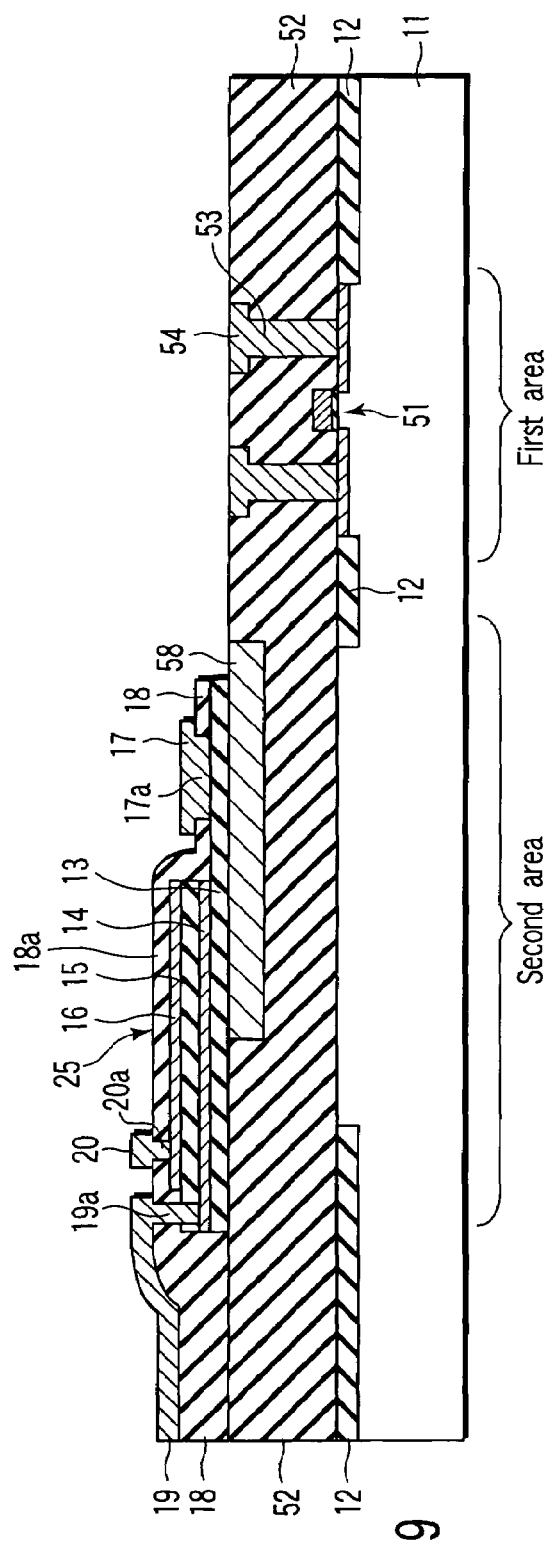
FIG. 29 is a cross-sectional view showing a manufacturing step of the semiconductor device according to the seventh embodiment of the present invention, following the step of FIG. 28.

Next, the actuator 25, the first electrode layer 17 and the wiring layers 19, 20 are formed on the sacrificial layer 58 and the interlayer insulation layer 52, as shown in FIG. 29. At this time, the sacrificial layer 58 is partially exposed in advance, at the edge portion of the insulation layer 13.

Figure 30:
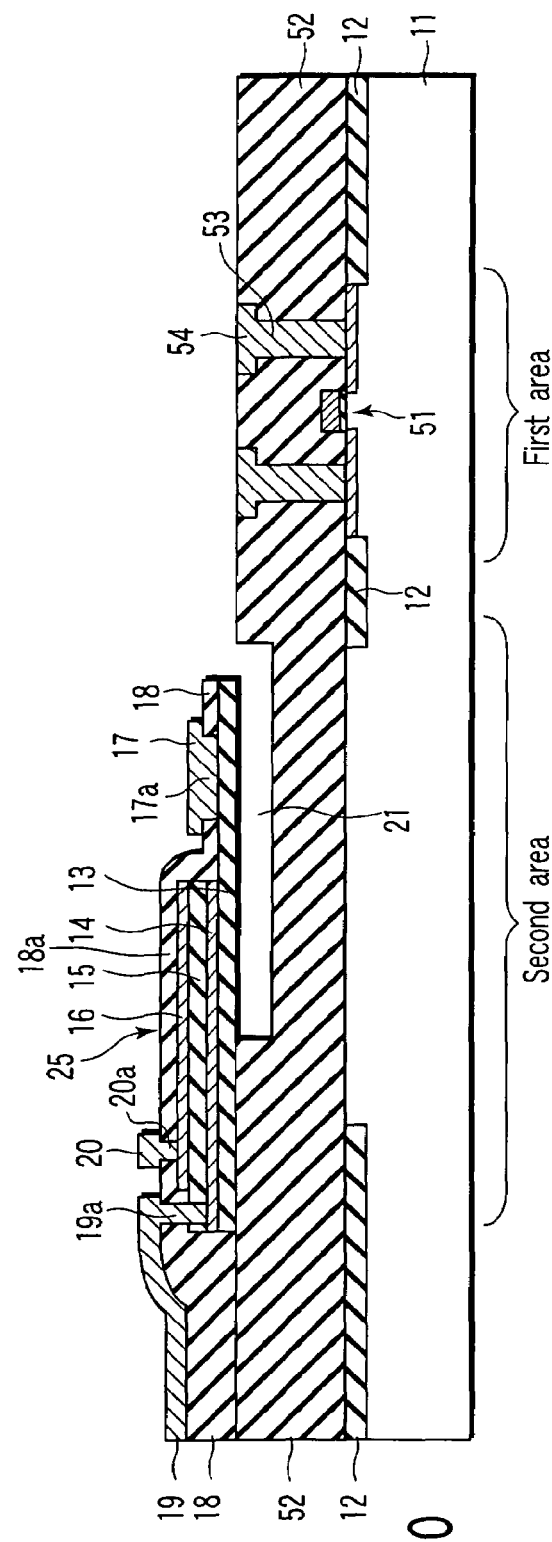
FIG. 30 is a cross-sectional view showing a manufacturing step of the semiconductor device according to the seventh embodiment of the present invention, following the step of FIG. 29.

Next, the sacrificial layer 58 is etched by CDE method as shown in FIG. 30. As a result, the cavity 21 is formed under the insulation layer 13, in the interlayer insulation layer 52. After that, the substrate is covered with the cap portion 27.

According to the present embodiment, as described above, the sacrificial layer 58 used for formation of the cavity 21 can be formed in the transistor wiring layer processing step.

A low-k film having a small dielectric constant may be used for the interlayer insulation layer 52. As the low-k film, for example, a porous film can be used. Since the wiring capacitance can be reduced by using the low-k film, the performance speed of the transistor can be made higher.

Eighth Embodiment

A fifth example of the method of manufacturing a semiconductor device comprising, for example, a MOS transistor and a MEMS device, will be described.

Figure 31:
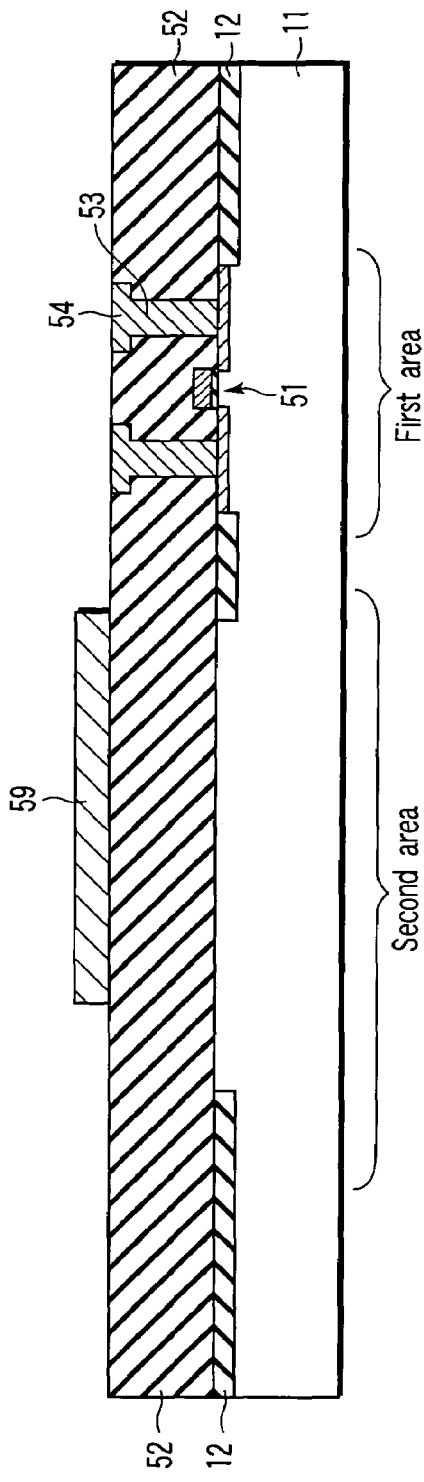
FIG. 31 is a cross-sectional view showing a manufacturing step of a semiconductor device according to an eighth embodiment of the present invention.

First, a sacrificial layer 59 is formed in the area where the cavity 21 is to be formed, in the interlayer insulation layer 52, as shown in FIG. 31. As the material of the sacrificial layer 59, an organic material, a metal such as Cu or the like, polysilicon, oxide film or the like can be used. In addition, any material can be used for the sacrificial layer 59 if it has a high selection ratio to the insulation material of the interlayer insulation layer 52.

Figure 32:
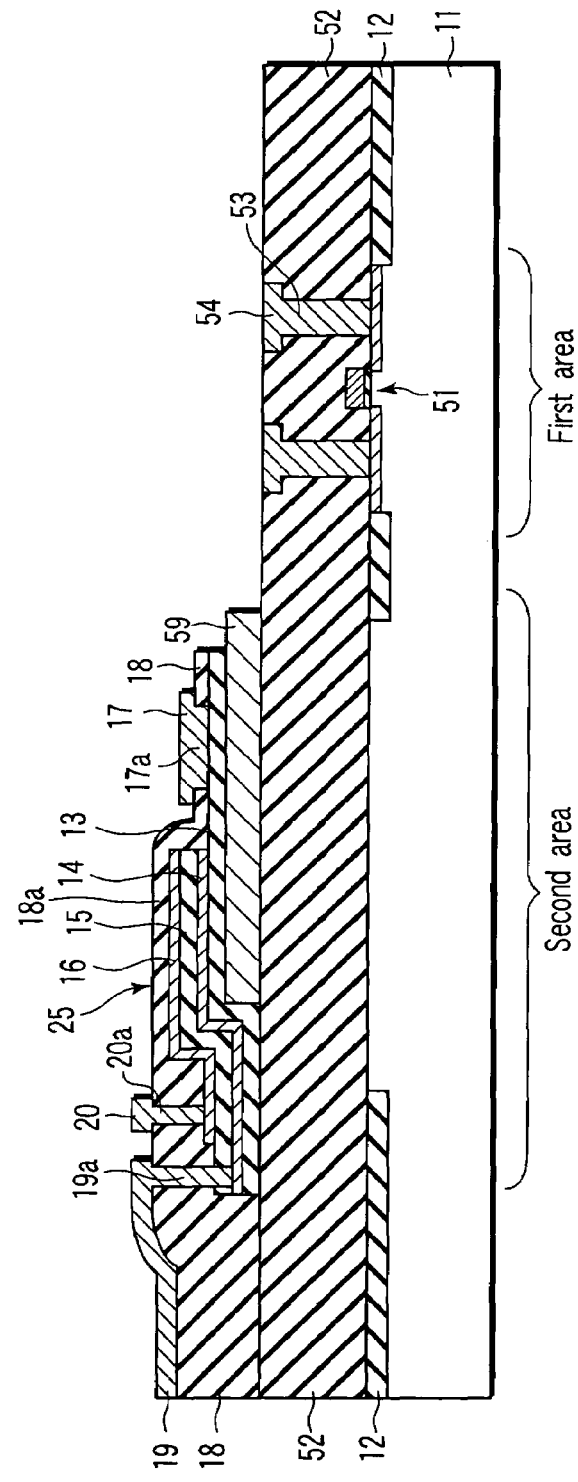
FIG. 32 is a cross-sectional view showing a manufacturing step of the semiconductor device according to the eighth embodiment of the present invention, following the step of FIG. 31.

Next, the actuator 25, the first electrode layer 17 and the wiring layers 19, 20 are formed on the sacrificial layer 59 and the interlayer insulation layer 52, as shown in FIG. 32. At this time, the sacrificial layer 59 is partially exposed in advance, at the edge portion of the insulation layer 13.

Figure 33:
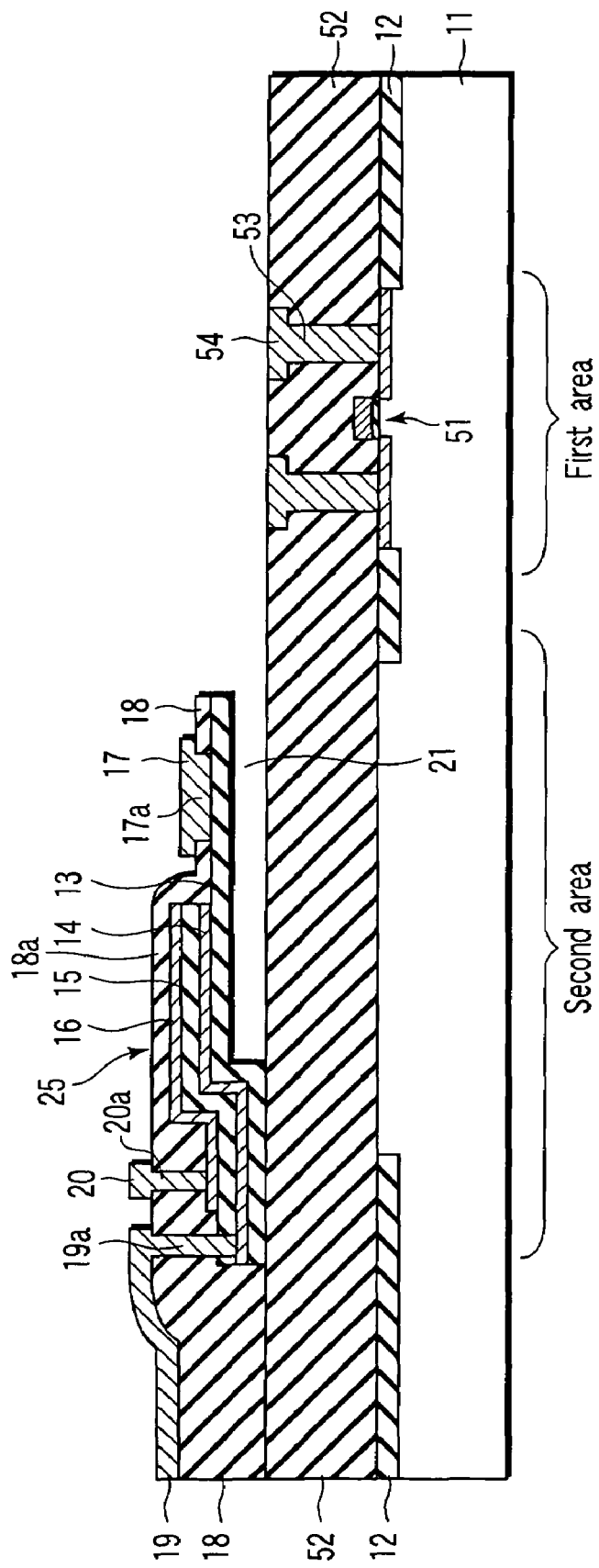
FIG. 33 is a cross-sectional view showing a manufacturing step of the semiconductor device according to the eighth embodiment of the present invention, following the step of FIG. 32.

Next, the sacrificial layer 59 is etched by CDE method as shown in FIG. 33. As a result, the cavity 21 is formed under the insulation layer 13, on the interlayer insulation layer 52. After that, the substrate is covered with the cap portion 27.

According to the present embodiment, as described above, the sacrificial layer 58 used for formation of the cavity 21 can be formed in the transistor wiring layer processing step. The semiconductor device of the present embodiment is thus formed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:

a semiconductor substrate;

an actuator provided above the semiconductor substrate to move upwardly;

a first electrode layer which is moved by the actuator; and a cap portion provided above the first electrode layer, configured to seal the actuator and the first electrode layer, and including a second electrode layer which faces the first electrode layer, wherein a cavity is provided between the semiconductor substrate and the actuator.

2. The semiconductor device according to claim 1, further comprising:

a first insulation layer provided on the semiconductor substrate, supporting the actuator and the first electrode layer; and a second insulation layer provided on the actuator and having a thickness smaller than a thickness of the first insulation layer, wherein the actuator includes a lower electrode layer, a piezoelectric layer provided on the lower electrode layer, and an upper electrode layer provided on the piezoelectric layer.

3. The semiconductor device according to claim 1, wherein the cap portion includes a third insulation layer provided under the second electrode layer, and the first electrode layer, the second electrode layer and the third electrode layer function as a variable capacitor.

4. The semiconductor device according to claim 1, wherein the first electrode layer and the second electrode layer function as a switch.

5. The semiconductor device according to claim 2, further comprising:

a fourth insulation layer provided between the semiconductor substrate and the second insulation layer and having a groove, wherein the cavity is formed in the groove of the fourth insulation layer and the first electrode layer is provided above the cavity.

6. The semiconductor device according to claim 1, wherein the cap portion includes a support layer which supports the second electrode layer.

7. The semiconductor device according to claim 1, wherein the second electrode layer covers the actuator and the first electrode layer, and the support layer surrounds the actuator and the first electrode layer.

8. The semiconductor device according to claim 7, wherein the cap portion functions as a package.

9. The semiconductor device according to claim 1, wherein a fixed potential is supplied to the second electrode layer.

10. The semiconductor device according to claim 3, wherein the cap portion includes an inductor electrically connected to the second electrode layer, and the variable capacitor and the inductor function as an LC tank circuit.

11. The semiconductor device according to claim 3, wherein the semiconductor substrate has a first area and a second area, the variable capacitor is formed in the first area, and a transistor including a gate electrode, source region and drain region is formed in the second area.

* * * * *